(12) United States Patent
Vasudevan

(10) Patent No.: US 7,701,245 B1
(45) Date of Patent: Apr. 20, 2010

(54) ENHANCED VOLTAGE REGULATION WITH POWER SUPPLY DISABLE CAPABILITY FOR LOW-POWER OPERATION

(75) Inventor: Narasimhan Vasudevan, Los Angeles, CA (US)

(73) Assignee: Xilinx, Inc., San Jose, CA (US)

( * ) Notice: Subject to any disclaimer, the term of this patent is extended or adjusted under 35 U.S.C. 154(b) by 94 days.

(21) Appl. No.: 11/977,863

(22) Filed: Oct. 26, 2007

(51) Int. Cl.
*H03K 17/16* (2006.01)
*H03K 19/003* (2006.01)

(52) U.S. Cl. .................. 326/33; 327/537; 327/541; 327/544

(58) Field of Classification Search ............ 326/33; 327/530, 534–535, 537–541, 543–544; 323/274, 323/283, 284, 268, 271, 282, 285; 307/51, 307/75, 76, 80, 85, 86
See application file for complete search history.

(56) References Cited

U.S. PATENT DOCUMENTS

| | | | |
|---|---|---|---|
| 5,216,289 A | 6/1993 | Hahn et al. | |
| 5,786,724 A | 7/1998 | Teggatz | |
| 6,653,751 B1 * | 11/2003 | Teh Lo | 307/125 |
| 7,046,074 B2 | 5/2006 | Jang | |
| 7,215,043 B2 | 5/2007 | Tsai et al. | |
| 7,265,605 B1 | 9/2007 | Vasudevan | |
| 2004/0140719 A1 * | 7/2004 | Vulih et al. | 307/80 |
| 2005/0146230 A1 * | 7/2005 | Tsai et al. | 307/130 |
| 2007/0069807 A1 * | 3/2007 | Ho | 327/541 |
| 2008/0174181 A1 * | 7/2008 | Kuo | 307/80 |

OTHER PUBLICATIONS

U.S. Appl. No. 11/977,831, filed Oct. 26, 2007, Vasudevan.
U.S. Appl. No. 11/978,010, filed Oct. 26, 2007, Vasudevan.

* cited by examiner

*Primary Examiner*—James H. Cho
*Assistant Examiner*—Jany Tran
(74) *Attorney, Agent, or Firm*—Michael T. Wallace; Thomas George

(57) ABSTRACT

A method and apparatus is provided that facilitates low-power consumption during a suspend mode of operation of an integrated circuit (IC), while substantially eliminating current paths within the IC that may be created should any of the power supplies be deactivated during the suspend mode. Deactivation of one or more power supplies during a normal mode of operation is also facilitated, whereby current paths created by the deactivated power supplies are also eliminated. Voltage bias circuitry is added to certain voltage regulators within the IC, so as to maintain those voltage regulators inactive due to a drop in voltage magnitude that is sensed when one or more power supplies are disabled. In addition, a well bias circuit is employed to maintain the substrate bias potential of certain devices within the voltage regulators and associated amplifiers to a fixed potential depending upon the operational mode of the IC.

19 Claims, 14 Drawing Sheets

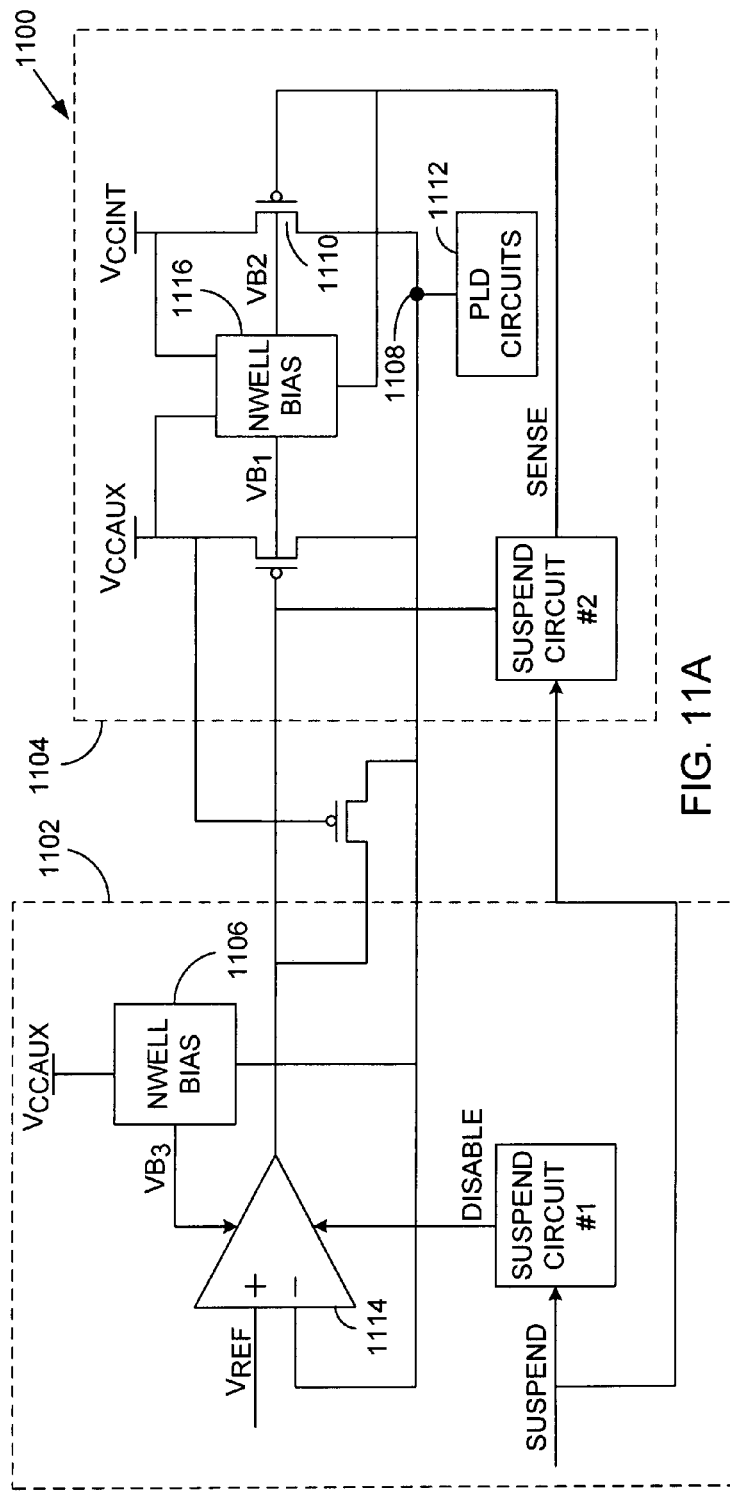
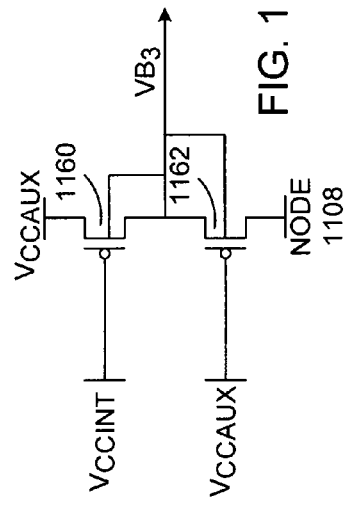
FIG. 11C
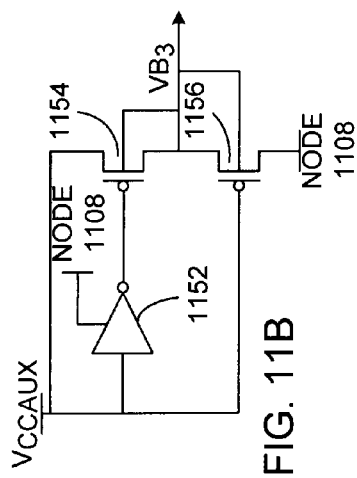
FIG. 11A
FIG. 11B

ENHANCED VOLTAGE REGULATION WITH POWER SUPPLY DISABLE CAPABILITY FOR LOW-POWER OPERATION

FIELD OF THE INVENTION

The present invention generally relates to programmable logic devices (PLDs), and more particularly to PLDs that facilitate power supply disablement during all modes of operation to prohibit unnecessary current drain.

BACKGROUND OF THE INVENTION

PLDs are a well-known type of integrated circuit that may be programmed to perform specified logic functions. One type of PLD, the Field Programmable Gate Array (FPGA), typically includes an array of programmable tiles. These programmable tiles can include, for example, Input/Output Blocks (IOBs), Configurable Logic Blocks (CLBs), dedicated Random Access Memory Blocks (BRAMs), multipliers, Digital Signal Processing blocks (DSPs), processors, clock managers, Delay Lock Loops (DLLs), Multi-Gigabit Transceivers (MGTs) and so forth.

Each programmable tile typically includes both programmable interconnect and programmable logic. The programmable interconnect typically includes a large number of interconnect lines of varying lengths interconnected by Programmable Interconnect Points (PIPs). The programmable logic implements the logic of a user design using programmable elements that may include, for example, function generators, registers, arithmetic logic, and so forth.

The programmable interconnect and the programmable logic are typically programmed by loading a stream of configuration data into internal configuration memory cells during a configuration event that defines how the programmable elements are configured. The configuration data may be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output (I/O) resources by an interconnect switch matrix. Each function block of the CPLD includes a two-level AND/OR structure similar to those used in Programmable Logic Arrays (PLAs) and Programmable Array Logic (PAL) devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these PLDs, the functionality of the device is controlled by configuration data bits provided to the device for that purpose. The configuration data bits can be stored in volatile memory (e.g., static memory cells, as in FPGAs and some CPLDs), in non-volatile memory (e.g., FLASH memory, as in some CPLDs), or in any other type of memory cell. Static random access memory (SRAM) is an exemplary memory device that is commonly used to store the configuration data bits. The contents of SRAM, however, is lost whenever operational power is removed. As such, operational power is required at all times to maintain the contents of the SRAM intact.

Some PLDs, such as the Xilinx Virtex® FPGA, can be programmed to incorporate blocks with pre-designed functionalities, i.e., "cores". A core can include a predetermined set of configuration data bits that program the FPGA to perform one or more functions. Alternatively, a core can include source code or schematics that describe the logic and connectivity of a design. Typical cores can provide, but are not limited to, DSP functions, memories, storage elements, and math functions. Some cores include an optimally floor planned layout targeted to a specific family of FPGAs. Cores can also be parameterizable, i.e., allowing the user to enter parameters to activate or change certain core functionality.

Generally, one or more power supplies are often utilized to provide operational power to one or more regions within the PLD. For example, a first power supply may be utilized to provide operational power to core logic within the PLD, such as CLBs and BRAMS, while a second power supply may be used to provide operational power to IOBs, DSPs, memory cells, and other higher voltage circuitry within the PLD. Other power supplies may also be used as necessary depending upon the application.

For example, FIG. 1 exemplifies PLD 100, whereby two power supplies, e.g., $V_{CCAUX}$ and $V_{CCINT}$, are utilized. Upon power-up of PLD 100, power-on reset (POR) circuit 114 deasserts the control terminal of p-type metal oxide semiconductor (PMOS) transistor 106 to logic a low value, which causes PMOS transistor 106 to transition to a conductive state. The conductive state of PMOS transistor 106 allows current to flow from $V_{CCINT}$ to node 110, thereby charging node 110 to a voltage magnitude that is substantially equal to $V_{CCINT}$ during the power-up sequence.

Once node 110 has reached an acceptable voltage magnitude, e.g., acceptable for initializing PLD circuits 108, POR circuit 114 asserts the control terminal of PMOS transistor 106 to a logic high value, which renders PMOS transistor 106 non-conductive, so as to isolate $V_{CCINT}$ from node 110. Operational amplifier 102 then becomes operational and regulates the voltage magnitude at node 110 using $V_{CCAUX}$ by adjusting the gate voltage of PMOS transistor 104 until node 110 achieves a voltage magnitude that is substantially equal to $V_{REF}$. As can be seen, however, device 100 does not exhibit a low-power, or suspend mode of operation, since all components of PLD 100, except PMOS transistor 106, remain active once the power-up sequence is complete.

Some FPGAs, therefore, may be configured to provide the lowest possible standby power, i.e., during a suspend mode of operation, which minimizes the amount of operational power that is consumed. In particular, after the PLD enters the suspend mode, all non-essential PLD functions are shut down to minimize power dissipation. All writable clocked elements are write protected against spurious write operations and all PLD inputs and outputs are shut down, which allows the application state of the PLD to be held static during suspend mode. Operational power is, however, maintained to critical circuits within the PLD, such as the SRAM configuration memory, so as to preserve the configured state of the PLD during the suspend mode.

Turning to FIG. 2, for example, an exemplary embodiment of PLD 200 is illustrated, in which a low-power operation during the suspend mode is facilitated. Operation of PLD 200 during normal operation, i.e., the awake mode, is such that signal SUSPEND is deasserted to a logic low level. In response, suspend circuit 216 deasserts signal DISABLE and asserts signal POWER DOWN, which renders transistor 210 non-conductive. In response, operational amplifier 202, in combination with transistor 204, regulates the voltage magnitude at node 212 to be substantially equal to $V_{REF}$ to supply operational power to PLD circuits 214.

The operation of well bias circuit 208 is discussed in U.S. patent Ser. No. 11/252,504 filed on Oct. 18, 2005 by Narasimhan Vasudevan and is incorporated herein by reference in its entirety. Generally, well bias circuit 208 maintains the well potential of transistors 204 and 210 at a voltage magnitude that prevents inadvertent forward biasing of the body diodes that exist within transistors 204 and 210. During the awake mode, for example, the voltage magnitude, $VB_1$, is applied to the well region of transistor 204 by well bias circuit 208 and is substantially equal to $V_{CCAUX}$. Similarly, the voltage magnitude, $VB_2$, is applied to the well region of transistor 210 by well bias circuit 208 and is substantially equal to the voltage magnitude at node 212. As such, inadvertent forward biasing of the body diodes within transistors 204 and 210 is substantially prevented.

The suspend mode of operation is entered by asserting signal SUSPEND, which causes suspend circuit 216 to assert signal DISABLE. In response, the voltage magnitude at the output of operational amplifier 202 is substantially equal to $V_{CCAUX}$, which renders transistor 204 non-conductive. In addition, suspend circuit 216 deasserts signal POWER DOWN, which causes transistor 210 to enter a conductive state. In response, the voltage magnitude at node 212 is substantially equal to $V_{CCINT}$ by operation of transistor 210. PLD circuits 214 then derive operational power from $V_{CCINT}$, which is at a lower voltage magnitude than $V_{REF}$. In one embodiment, PLD circuits 214 are composed of static random access memory (SRAM), which provides the configuration memory for PLD 200. The leakage current of SRAM decreases exponentially with decreasing supply voltage. Thus, the amount of power consumed by the SRAM during the suspend mode is reduced considerably because the voltage magnitude of $V_{CCINT}$ is generally lower than the voltage magnitude of $V_{REF}$. Thus, operational power is further reduced even while conserving the configuration memory of PLD 200 during the suspend mode.

As can be verified from FIG. 2, however, deactivation of power supply $V_{CCAUX}$ or $V_{CCINT}$ causes a low-impedance current path to exist. For example, if power supply $V_{CCAUX}$ is deactivated during the SUSPEND mode of operation, then a low-impedance current path exists from $V_{CCINT}$ through transistor 210, node 212 and transistor 204. The current path exists because the body diode of transistor 204 is forward biased due to the voltage magnitude of the drain terminal of transistor 204 being at a higher potential, e.g., $V_{CCINT}$, than the voltage magnitude of the well region of transistor 204, e.g., ground potential, due to the deactivated power supply $V_{CCAUX}$. In addition, the voltage magnitude at the control terminal of transistor 204 is also substantially zero due to the disablement of $V_{CCAUX}$, which renders transistor 204 conductive to create a low-impedance current path between $V_{CCAUX}$ and $V_{CCINT}$.

If power supply $V_{CCINT}$ is deactivated during the awake mode of operation, on the other hand, then a low-impedance current path exists from $V_{CCAUX}$ through transistor 204, node 212 and transistor 210. The current path exists because the body diode of transistor 210 is forward biased due to the voltage magnitude of the drain terminal of transistor 210 being at a higher potential, e.g., $V_{REF}$, than the voltage magnitude of the well region of transistor 210, e.g., ground potential, due to the deactivated power supply $V_{CCINT}$. In addition, the voltage magnitude at the control terminal of transistor 210 could be substantially equal to zero, which renders transistor 210 conductive to create a low-impedance current path between $V_{CCAUX}$ and $V_{CCINT}$.

Turning to FIG. 3, an alternate embodiment of PLD 300 is illustrated, in which a low-power operation during the suspend mode is facilitated, whereby activation of $V_{CCINT}$ during the suspend mode occurs in response to sensing the voltage magnitude output of operational amplifier 302 after a time delay. In particular, once signal SUSPEND is asserted, signal DISABLE is also asserted within suspend circuit 316 to deactivate operational amplifier 302. Once deactivated, the output voltage magnitude of operational amplifier 302 at node 304 is substantially equal to $V_{CCAUX}$, which causes transistors 306 and 318 to enter a non-conductive state. Once transistor 318 is rendered non-conductive and after delay 322, transistor 320 is rendered conductive to deassert signal SENSE to a logic low level. In response, transistor 310 is rendered conductive to allow PLD circuits 314 to derive operational power from power supply $V_{CCINT}$ via node 312 during the suspend mode.

The PLD of FIG. 3, however, causes low-impedance current paths to exist during the deactivation of power supply $V_{CCAUX}$ or $V_{CCINT}$ for similar reasons as discussed above in relation to FIG. 2. Efforts continue, therefore, to provide means to prevent current flow through the low-impedance current paths that are created when one or more power supplies are deactivated during the suspend or awake modes of operation.

SUMMARY OF THE INVENTION

To overcome limitations in the prior art, and to overcome other limitations that will become apparent upon reading and understanding the present specification, various embodiments of the present invention disclose an apparatus and method that substantially eliminates low impedance current paths due to deactivated power supplies during low-power and normal modes of operation.

In accordance with one embodiment of the invention, an integrated circuit comprises a voltage regulator that is coupled to receive a first power supply signal at a first node and is adapted to provide a regulated voltage to a second node in response to a normal mode of operation of the integrated circuit. The integrated circuit further comprises a first transistor having a first conductor that is coupled to receive a second power supply signal at a third node and a second conductor that is coupled to the second node, the first transistor being adapted to provide the second power supply signal to the second node in response to deactivation of the first power supply signal. The integrated circuit further comprises a second transistor having a first conductor that is coupled to the second node, a control terminal that is coupled to the first node, and a second conductor that is coupled to the voltage regulator. The second transistor senses deactivation of the first power supply signal and in response is adapted to prevent current flow between the first and third nodes.

In accordance with another embodiment of the invention, a method to facilitate deactivation of power supply signals received by an integrated circuit, the method comprising deriving operational power from a first power supply signal at a first node during a normal mode of operation, sensing deactivation of the first power supply signal, deriving operational power from a second power supply signal at a second node in response to sensing the deactivation of the first power supply signal. A current path between the first and second nodes is removed by the integrated circuit in response to the deactivation of the first power supply signal.

In accordance with another embodiment of the invention, a system comprises a first power supply that is adapted to provide a first power supply signal to a first node and a second power supply adapted to provide a second power supply signal to a second node. The system further comprises an integrated circuit that includes a first transistor having a first conductor that is coupled to receive the second power supply signal and a second conductor that is coupled to a third node.

The first transistor is adapted to provide the second power supply signal to the third node in response to a deactivation of the first power supply. The integrated circuit further including a second transistor having a first conductor that is coupled to the third node and a control terminal coupled to the first node. The integrated circuit further including an operational amplifier having a first input terminal that is coupled to receive a reference signal and a second input terminal that is coupled to receive a feedback signal from the third node. The integrated circuit further including a third transistor having a first conductor that is coupled to the first node, a second conductor that is coupled to the third node, and a control terminal that is coupled to an output terminal of the operational amplifier. The second transistor senses deactivation of the first power supply signal and in response is adapted to render the third transistor non-conductive to prevent current flow between the first and second nodes.

BRIEF DESCRIPTION OF THE DRAWINGS

Various aspects and advantages of the invention will become apparent upon review of the following detailed description and upon reference to the drawings in which:

FIG. 11A illustrates an exemplary schematic diagram of a PLD that facilitates the disablement of one or more power supplies during either of a normal, or low-power, mode of operation;

FIG. 11B illustrates an exemplary schematic diagram of a well bias circuit used in the PLD of FIG. 11A;

FIG. 11C illustrates an exemplary schematic diagram of an alternate embodiment of a well bias circuit used in the PLD of FIG. 11A;

DETAILED DESCRIPTION

Generally, various embodiments of the present invention are applied to the field of integrated circuits (ICs) of which programmable logic devices (PLDs) are a subset. A method and apparatus is provided that facilitates low-power consumption during a suspend mode of operation, while substantially eliminating current paths within the PLD that may be created should any of the power supplies be disabled during the suspend mode. Alternate embodiments facilitate the disablement of power supplies during a normal mode of operation, i.e., the awake mode, while substantially eliminating current paths within the PLD that may be caused by the disablement of the power supplies during the awake mode.

During the suspend mode, power supplies may be disabled and certain other power supplies may remain enabled, thereby providing operational power to certain critical circuitry within the PLD during the suspend mode. For example, configuration memory cells may be maintained in their configured logic state during the suspend mode, so as to obviate the necessity to reconfigure the configuration memory cells once the PLD recovers from the suspend mode. In order to eliminate low-impedance current paths due to the disablement of one or more power supplies, voltage bias circuitry is added.

For example, voltage bias circuitry is added to certain voltage regulators within the PLD, so as to maintain those voltage regulators inactive during the suspend mode. In one embodiment, a voltage-controlled current conduction device, such as a field effect transistor (FET), is utilized to sense the drop in voltage magnitude that is provided by the disabled power supply during the suspend mode. The current conduction device is then utilized to provide a signal to the voltage regulator that is associated with the disabled power supply to disable the current path that is created when the power supply is disabled. As such, the deactivation of the power supply is sensed by the PLD and in response, the associated current path within the PLD is then disabled by the PLD. In such an instance, power supplies, and associated voltage regulators, that remain active during the suspend mode are prohibited from inadvertently creating a low-impedance current path through the voltage regulators and associated power supplies that are disabled during the suspend mode.

The disablement of power supplies during the normal mode of operation is also facilitated. In particular, operation of the suspend circuitry within the PLD is enhanced to accelerate the activation of an alternate power supply when one or more power supplies are deactivated during the normal mode. In addition, low-impedance current paths between the deactivated power supply and the activated power supply are removed.

Figure 1:
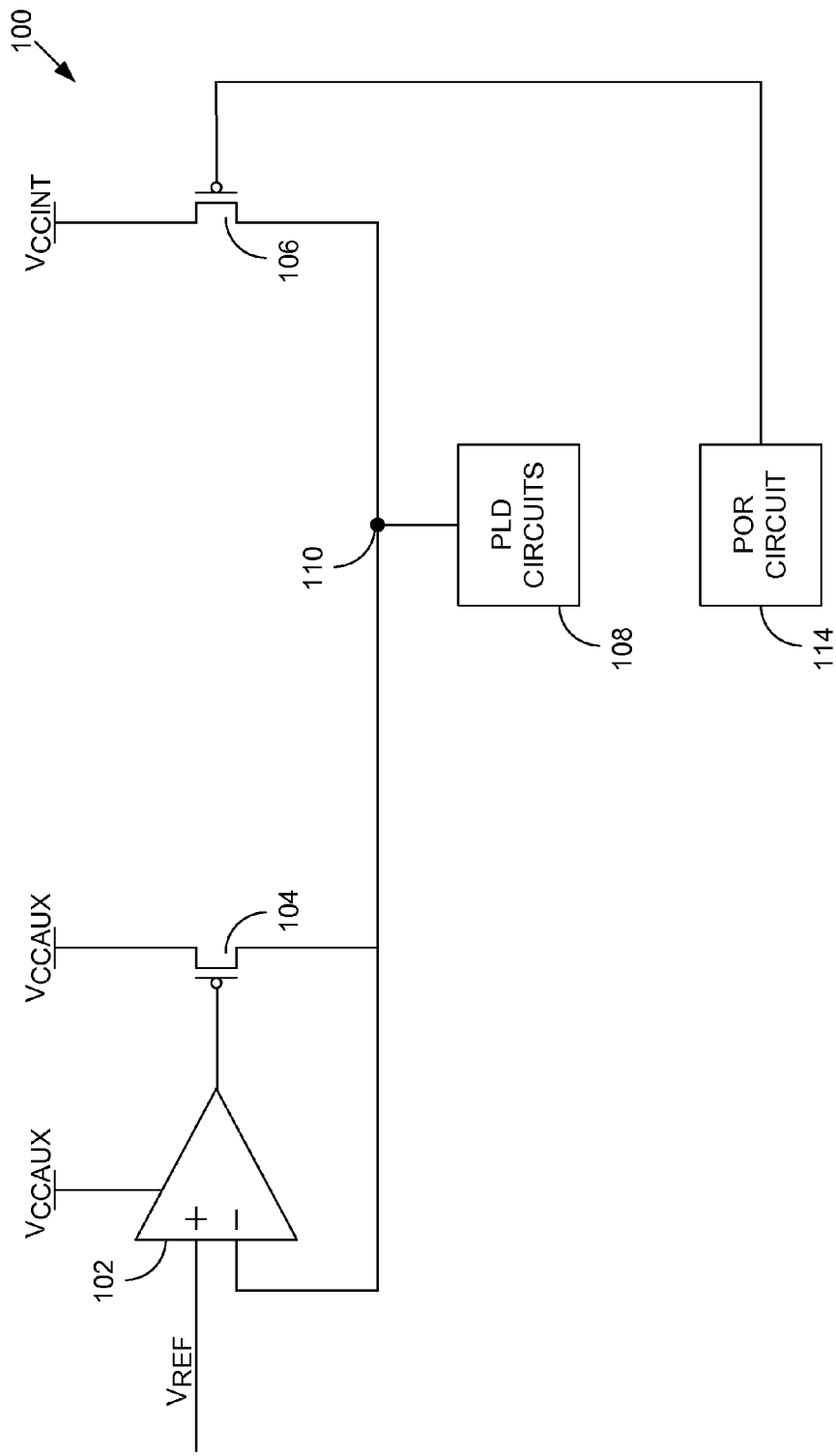
FIG. 1 illustrates an exemplary programmable logic device (PLD) that does not facilitate a low-power mode of operation.
Figure 2:
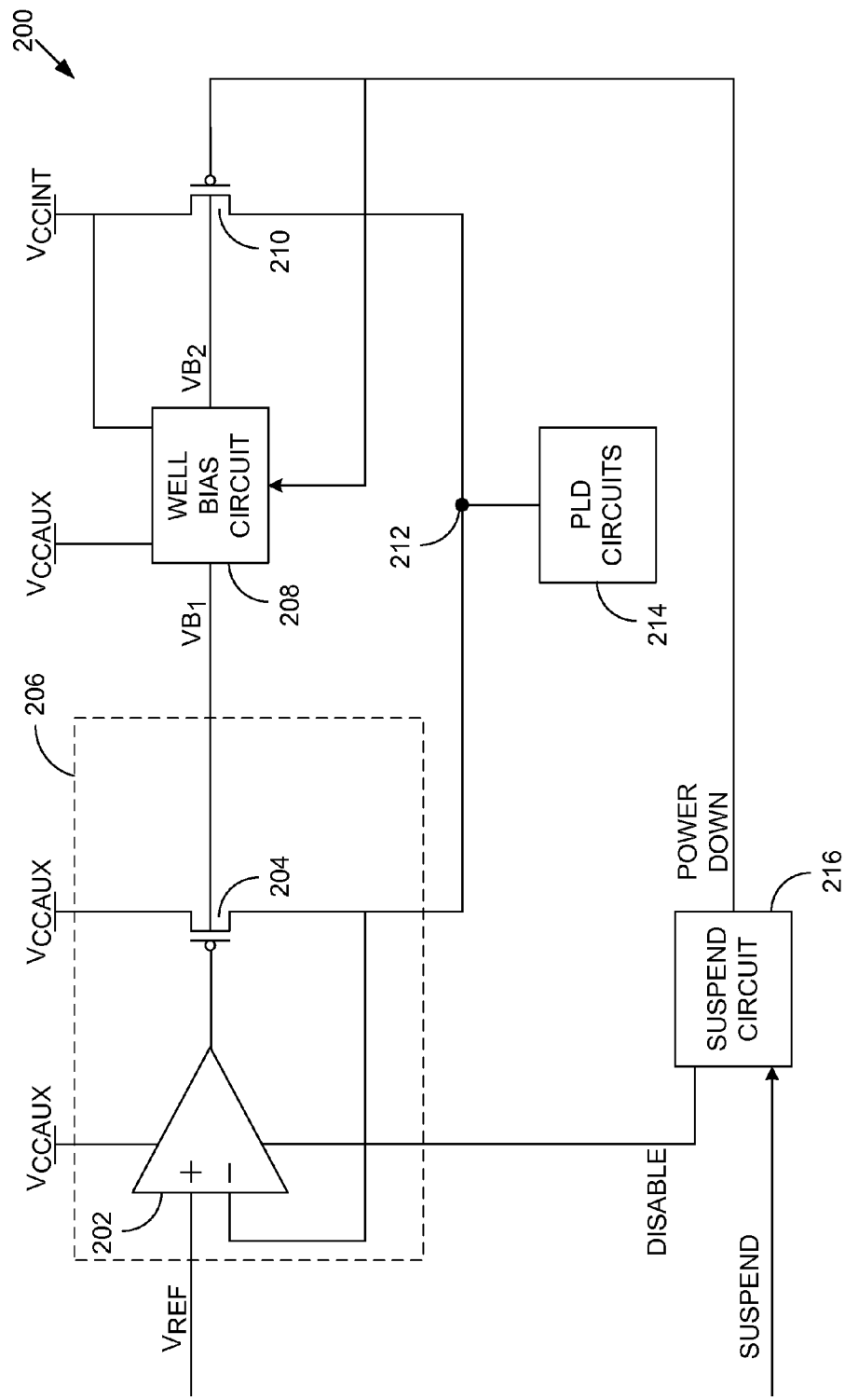
FIG. 2 illustrates an exemplary PLD that does facilitate a low-power mode of operation, but does not facilitate the deactivation of one or more power supplies during either of a normal, or low-power, mode of operation.
Figure 3:
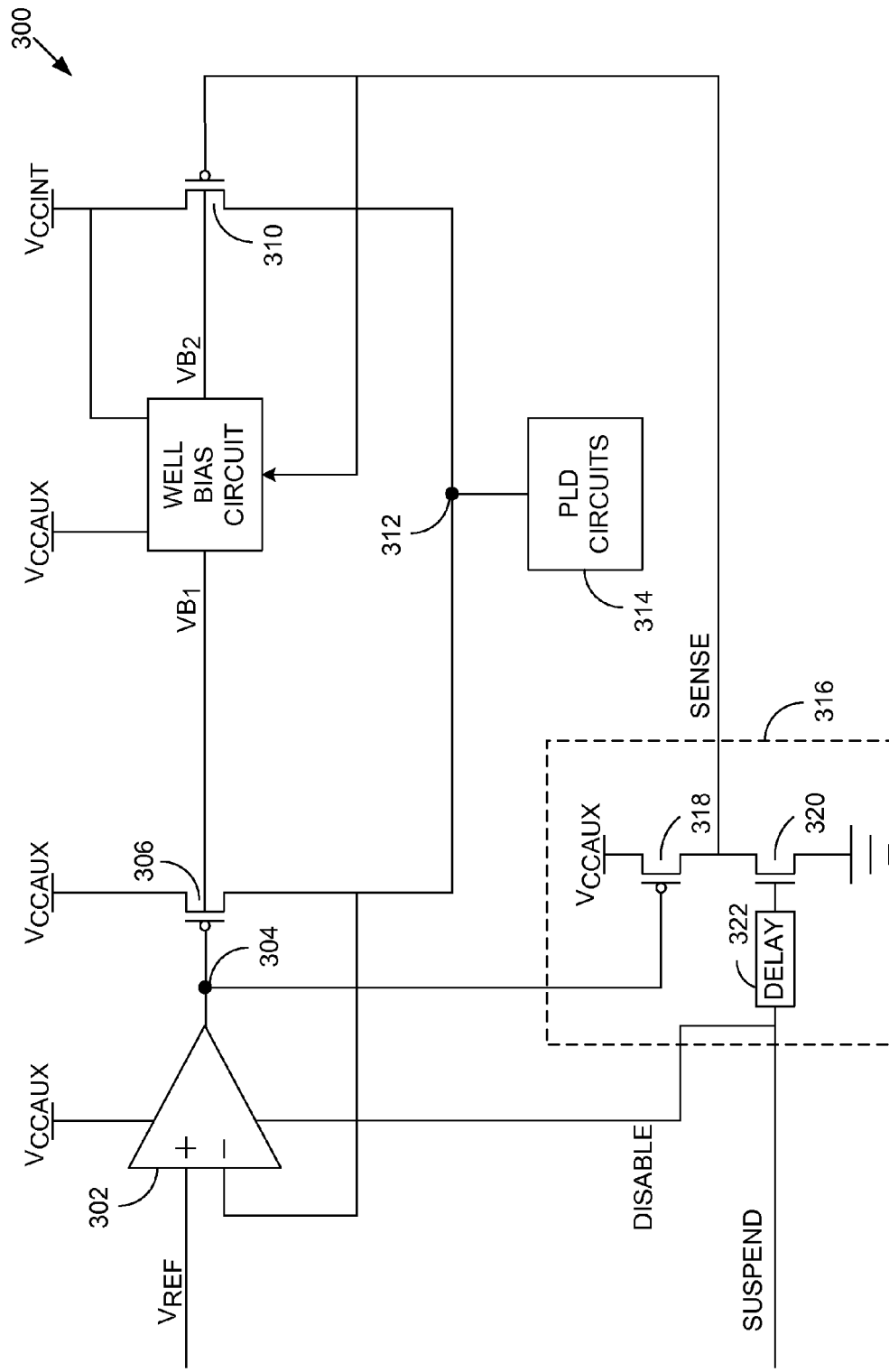
FIG. 3 illustrates an alternate PLD that does facilitate a low-power mode of operation, but does not facilitate the disablement of one or more power supplies during either of a normal, or low-power, mode of operation.
Figure 4:
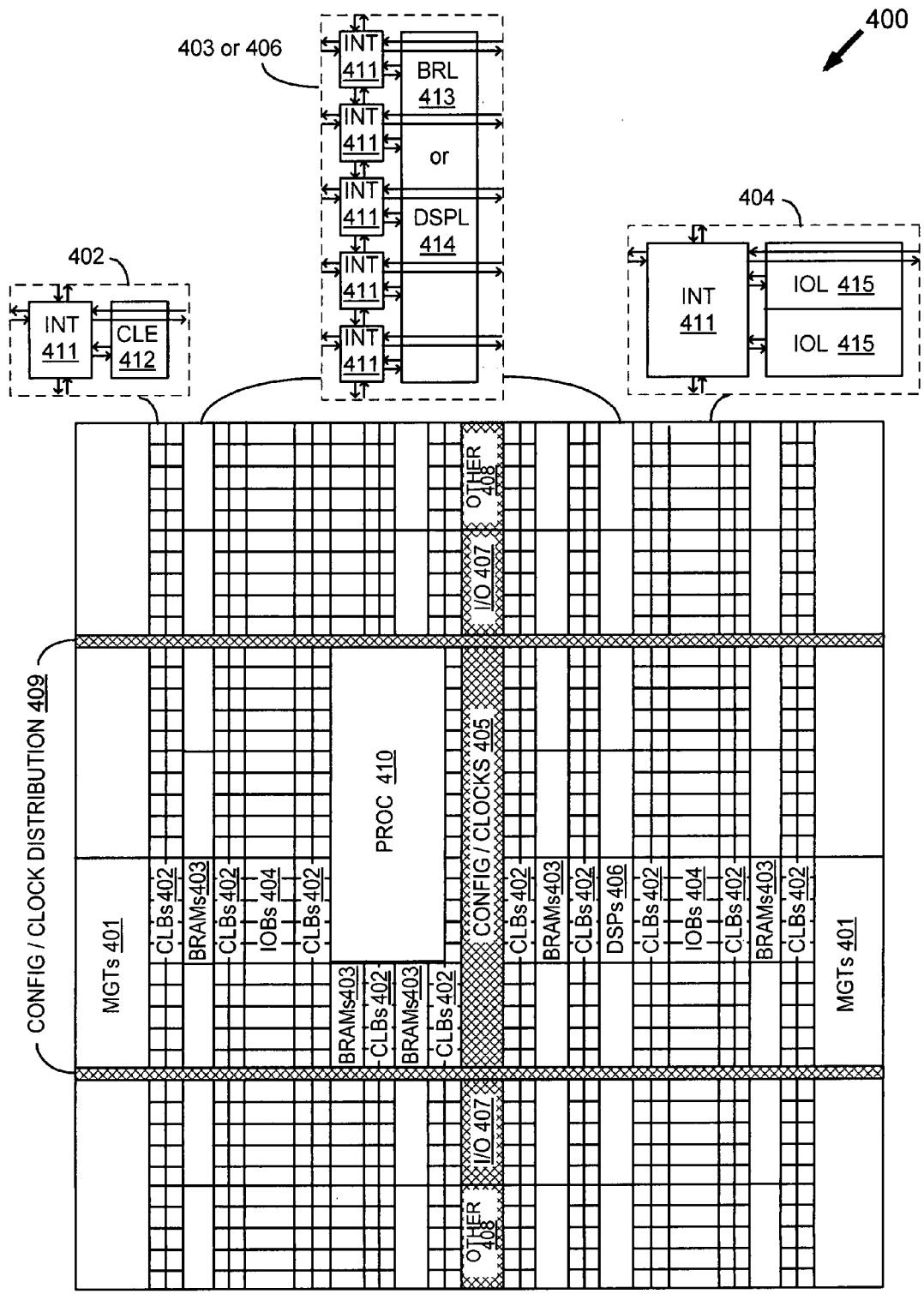
FIG. 4 illustrates an exemplary Field Programmable Gate Array (FPGA) architecture.

As noted above, advanced FPGAs can include several different types of programmable logic blocks in the array. For example, FIG. 4 illustrates an FPGA architecture 400 that includes a large number of different programmable tiles including multigigabit transceivers (MGTs 401), configurable logic blocks (CLBs 402), random access memory blocks (BRAMs 403), input/output blocks (IOBs 404), configuration and clocking logic (CONFIG/CLOCKS 405), digital signal processing blocks (DSPs 406), specialized input/output blocks (I/O 407) (e.g., configuration ports and clock ports), and other programmable logic 408 such as digital clock managers, analog-to-digital converters, system monitoring logic, and so forth. Some FPGAs also include dedicated processor blocks (PROC 410).

In some FPGAs, each programmable tile includes a programmable interconnect element (INT 411) having standardized connections to and from a corresponding interconnect element in each adjacent tile. Therefore, the programmable interconnect elements taken together implement the programmable interconnect structure for the illustrated FPGA. The programmable interconnect element (INT 411) also includes the connections to and from the programmable logic element within the same tile, as shown by the examples included at the top of FIG. 4.

For example, a CLB 402 can include a configurable logic element (CLE 412) that can be programmed to implement user logic plus a single programmable interconnect element (INT 411). A BRAM 403 can include a BRAM logic element (BRL 413) in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 406 can include a DSP logic element (DSPL 414) in addition to an appropriate number of programmable interconnect elements. An IOB 404 can include, for example, two instances of an input/output logic element (IOL 415) in addition to one instance of the programmable interconnect element (INT 411). As will be clear to those of skill in the art, the actual I/O pads connected, for example, to the I/O logic element 415 typically are not confined to the area of the input/output logic element 415.

In the pictured embodiment, a columnar area near the center of the die (shown shaded in FIG. 4) is used for configuration, clock, and other control logic. Horizontal areas 409 extending from this column are used to distribute the clocks and configuration signals across the breadth of the FPGA.

Some FPGAs utilizing the architecture illustrated in FIG. 4 include additional logic blocks that disrupt the regular columnar structure making up a large part of the FPGA. The additional logic blocks can be programmable blocks and/or dedicated logic. For example, the processor block PROC 410 shown in FIG. 4 spans several columns of CLBs and BRAMs.

Note that FIG. 4 is intended to illustrate only an exemplary FPGA architecture. For example, the number of logic blocks in a column, the relative width of the columns, the number and order of columns, the types of logic blocks included in the columns, the relative sizes of the logic blocks, and the interconnect/logic implementations included at the top of FIG. 4 are purely exemplary. For example, in an actual FPGA more than one adjacent column of CLBs are typically included wherever the CLBs appear, to facilitate the efficient implementation of user logic, but the number of adjacent CLB columns varies with the overall size of the FPGA.

In a suspend mode of operation, portions of FPGA 400 may be deactivated, or disabled, so as to reduce the amount of operational current required by FPGA 400 during the suspend mode. In particular, after FPGA 400 enters the suspend mode, all non-essential FPGA functions are shut down to minimize power dissipation. All writable clocked elements are write protected against spurious write operations and all FPGA inputs and outputs are shut down, which allows the application state of the FPGA to be held static during suspend mode. FPGA 400 may also be configured to facilitate the removal of one or more power supplies during either of the normal or suspend modes.

That is to say, in other words, that FPGA 400 typically utilizes several power supplies to provide operational power at various voltage magnitudes. For example, a first power supply is generally used to provide operational power to relatively higher voltage tiles, such as IOBs 404, CONFIG/CLOCKS 405, DSPs 406, I/O 407, and other programmable logic 408 such as digital clock managers, analog-to-digital converters, system monitoring logic, and so forth. The magnitude of voltage provided by the first power supply may be selected to, e.g., 2.5V or 3.3V, depending upon the particular FPGA application. A second power supply may also be utilized to provide operational power to relatively lower voltage tiles, such as CLBs 402 and BRAMs 403. The magnitude of voltage provided by the second power supply may be selected to a relatively lower potential, e.g., 1.2V, as compared to the voltage magnitude provided by the first power supply.

In order to further reduce the current required by FPGA 400 during the suspend mode, it may be desirable to disable one of the power supplies, e.g., the first power supply, so as to deprive the high voltage tiles of FPGA 400 of operational power. Certain of the high voltage tiles, however, may contain critical circuits that are to remain operational during the suspend mode. In such an instance, operational power for the critical circuits may instead be derived from the second power supply, which remains enabled during the time that the first power supply is disabled.

It may also be desirable to disable one of the power supplies during the normal mode. For example, a critical function state of FPGA 400 may be maintained even during a failure of one power supply during the normal mode of operation. In such an instance, the failed power supply may be replaced with an operational power supply while the critical function state of the FPGA remains operational.

Figure 5:
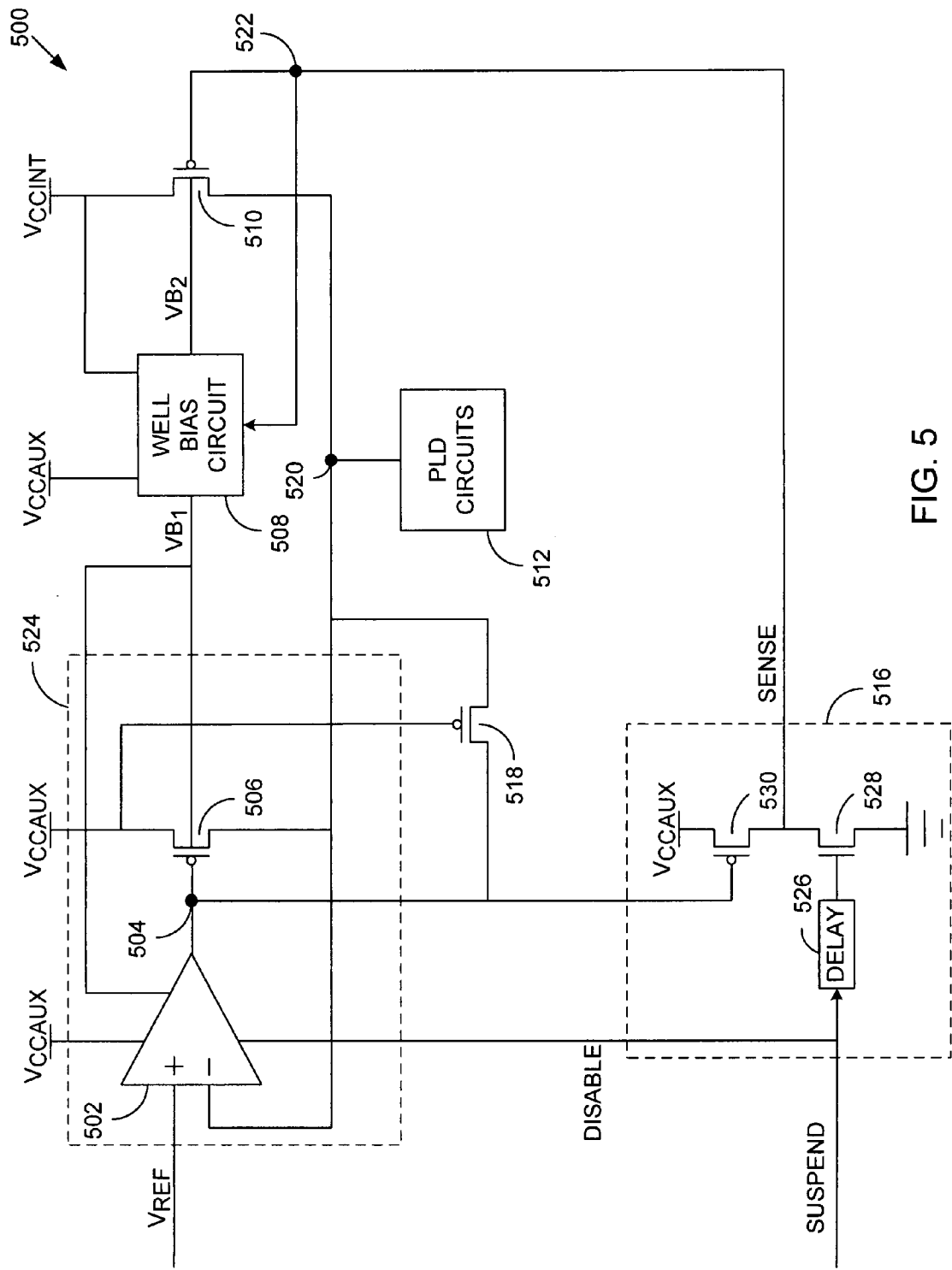
FIG. 5 illustrates an exemplary schematic diagram of a PLD that facilitates the disablement of one or more power supplies during either of a normal, or low-power, mode of operation.

Turning to FIG. 5, an exemplary schematic diagram of PLD 500 is illustrated, whereby the control circuitry used to alternate between enabled and disabled power supplies without creating low-impedance current paths is exemplified. In the suspend mode, PLD 500 selects an alternate power supply, e.g., $V_{CCINT}$, and associated voltage regulator to provide operational power to PLD circuits 512. In addition, PLD 500 also senses that a first power supply, e.g., $V_{CCAUX}$, is disabled during the suspend mode. In response, PLD 500 provides bias control circuitry to apply appropriate substrate and control terminal potentials to certain devices within PLD 500 so that low-impedance current paths caused by the disablement of the first power supply during the suspend mode may be virtually eliminated.

As discussed above, PLD circuits 512 may be configured to be any element within PLD 500 that is deemed to remain operational during the suspend mode. In one embodiment, PLD circuits 512 may be comprised of volatile configuration memory cells that would otherwise lose their configured logic state if operational power were to be removed from node 520 during the suspend mode.

In normal operation, PLD circuits 512 derives operational power from power supply $V_{CCAUX}$ via node 520. The voltage magnitude provided by power supply $V_{CCAUX}$ to node 520 is regulated by voltage regulator 524, which is comprised of operational amplifier 502, transistor 506, and other components that are not shown for simplicity. A reference voltage, $V_{REF}$, is provided to, e.g., the non-inverting terminal, of operational amplifier 502 from a voltage reference source.

$V_{REF}$ may be generated by any number of means such as a bandgap reference, an external stable supply, locally generated stable voltage levels, or other means. Voltage feedback is provided to, e.g., the inverting terminal, of operational amplifier 502 from node 520, whereby operational amplifier 502 seeks to maintain the voltage magnitude at node 520 to be substantially equal to the voltage magnitude of $V_{REF}$ via transistor 506. That is to say, in other words, that the output voltage of operational amplifier 502 at node 504 renders transistor 506 conductive, thereby causing a drain-to-source voltage drop, $V_{DS\text{-}506}$, across transistor 506. Thus, under normal operating conditions, the voltage at node 520, $V_{520}$, is substantially equal to:

$$V_{520} = V_{CCAUX} - V_{DS\text{-}506} \cong V_{REF}, \qquad (1)$$

where $V_{CCAUX}$ is the supply voltage magnitude, e.g., 2.5-3.3 v, that is provided to the source terminal of transistor 506 and $V_{REF}$ is the reference voltage magnitude, e.g., 1.5 v, that is provided to the non-inverting input of operational amplifier 502. Under normal operating conditions, therefore, the voltage magnitude at node 520 is approximately equal to 1.5 v.

In addition, transistor 510 is rendered non-conductive during normal mode, via suspend circuit 516. In particular, transistor 530 is rendered conductive because the source-to-gate voltage applied across transistor 530 is larger than the threshold voltage of transistor 530. Additionally, transistor 528 is rendered non-conductive because signal SUSPEND is deasserted in normal mode. In response, the control voltage of the gate terminal of transistor 510, i.e., node 522, is at a logic high potential, thus rendering transistor 510 non-conductive. As such, power supply signal, $V_{CCINT}$, is isolated from node 520 during normal operation.

A suspend mode of operation may be signaled within PLD 500 via assertion of signal SUSPEND. In response, PLD 500 may enter a low-power mode of operation, whereby other circuitry (not shown) may be disabled in order to prevent unnecessary current drain from power supply signals $V_{CCAUX}$, $V_{CCINT}$, and any other power supply signals received by, or generated within, PLD 500. Furthermore, the state of PLD 500 during the suspend mode is such that signals SUSPEND and DISABLE are at logic high potentials, which disables operational amplifier 502 and sets the voltage magnitude at node 504 to be substantially equal to $V_{CCAUX}$. After time delay 526, signal SUSPEND renders transistor 528 conductive to deassert signal SENSE at node 522 to a logic low level. In response, transistor 510 is rendered conductive, thereby providing operational power to PLD circuits 512 via node 520 from $V_{CCINT}$.

During the suspend mode, additional power savings may be facilitated by deactivating power supply $V_{CCAUX}$. Upon deactivation of power supply $V_{CCAUX}$, the output of operational amplifier 502 drops to a low voltage magnitude, e.g., ground potential. The voltage magnitude at node 520, however, is substantially equal to $V_{CCINT}$ by operation of transistor 510 as discussed above, thus transistor 518 is rendered conductive. As such, the voltage magnitude at node 504 is maintained to be substantially equal to $V_{CCINT}$ by operation of transistor 518.

It can be seen, therefore, that transistor 518 senses the deactivated power supply $V_{CCAUX}$ because the voltage magnitude at the control terminal of transistor 518 falls to substantially ground potential while the voltage magnitude at the source terminal of transistor 518 is substantially equal to $V_{CCINT}$. As such, the drop in voltage at node 504 is compensated by the increase in voltage at node 504 by operation of transistor 518, which renders transistor 506 non-conductive to prevent a low-impedance current path to exist between power supplies $V_{CCINT}$ and $V_{CCAUX}$.

In addition, well bias circuit 508 senses the deactivation of power supply $V_{CCAUX}$ and in response, asserts the magnitude of signal $VB_1$ to be substantially equal to $V_{CCINT}$. Thus, the voltage magnitude at nodes 504 and 520 is maintained to be substantially equal to $V_{CCINT}$, which prevents a forward bias condition to exist across the body diode of transistor 506. As such, the impedance magnitude of the path from $V_{CCINT}$ through transistor 510, node 520, transistor 506, and $V_{CCAUX}$ is adequate to prevent current flow during the suspend mode while $V_{CCAUX}$ is deactivated.

If, on the other hand, power supply $V_{CCINT}$ is disabled instead of power supply $V_{CCAUX}$ during the suspend mode, then a similar result is achieved. In particular, the output voltage of operational amplifier 502 is substantially equal to $V_{CCAUX}$, which renders transistor 506 non-conductive. In addition, signal SENSE and power supply $V_{CCINT}$ are each at low voltage magnitudes, e.g., ground potential, thus transistor 510 is rendered non-conductive. In addition, the voltage magnitude at node 520 is substantially equal to zero due to the leakage current from PLD circuits 512. Still further, well bias circuit 508 asserts the voltage magnitude of signal $VB_1$ to be substantially equal to $V_{CCAUX}$ and deasserts the voltage magnitude of signal $VB_2$ to be substantially equal to ground potential. As such, the impedance magnitude of the path from $V_{CCAUX}$ through transistor 506, node 520, transistor 510, and $V_{CCINT}$ is adequate to prevent current flow during the suspend mode while $V_{CCINT}$ is deactivated.

PLD 500 also facilitates the removal of one or more power supplies during the awake mode. In particular, the state of PLD 500 during the awake mode is such that signals SUSPEND and DISABLE are at logic low values, thereby activating operational amplifier 502 and transistor 506 to regulate the voltage at node 520 to be substantially equal to $V_{REF}$ as discussed above. In addition, signal SENSE is asserted to a logic high value, transistor 510 is rendered non-conductive, signal $VB_1$ is substantially equal to $V_{CCAUX}$ and signal $VB_2$ is substantially equal to the voltage magnitude at node 520. Thus, removal of power supply $V_{CCINT}$ is facilitated without generating a low-impedance current path because power supply $V_{CCINT}$ is already isolated from node 520 through operation of transistor 510.

Figure 6:
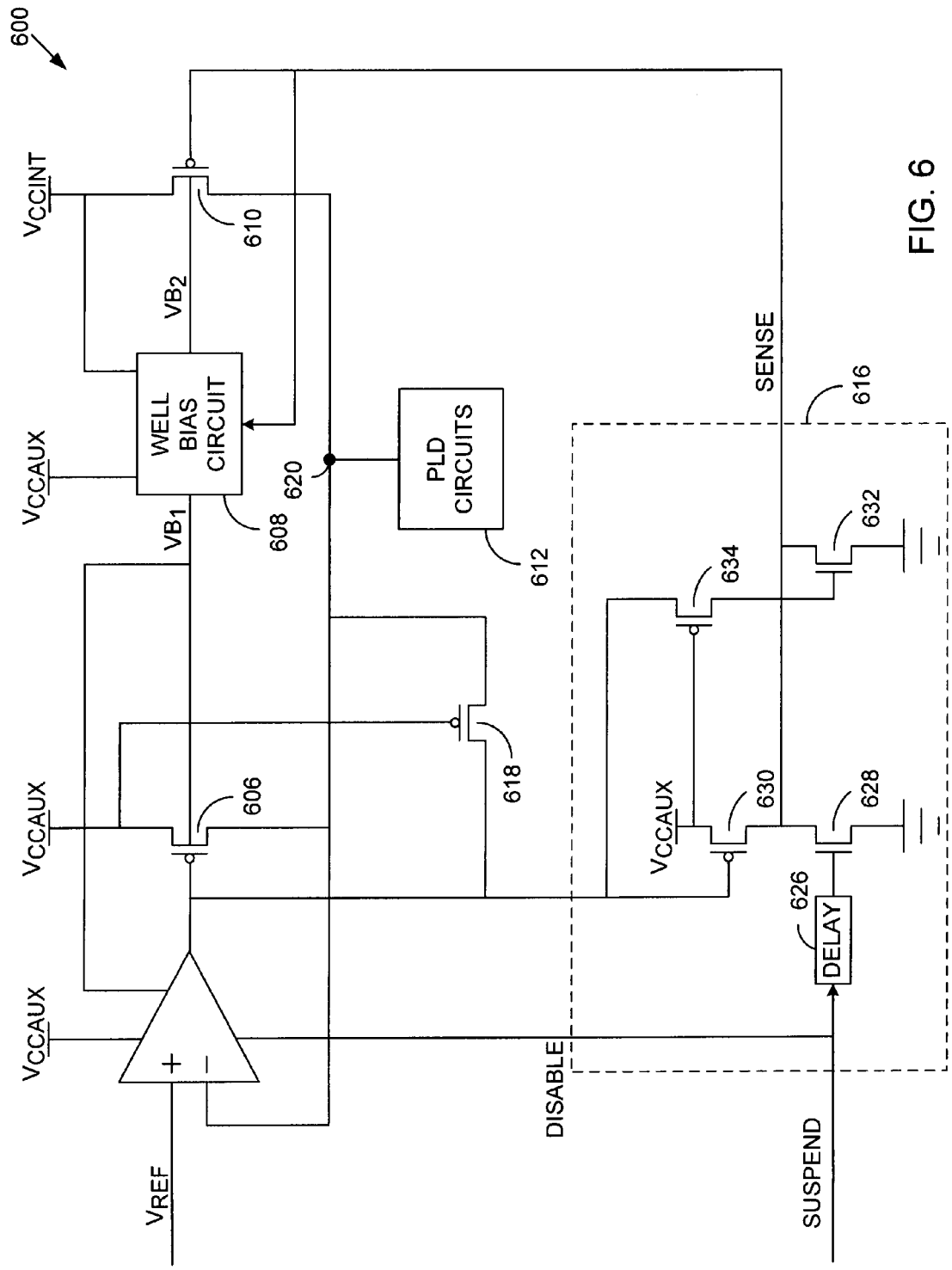
FIG. 6 illustrates an exemplary schematic diagram of an alternate embodiment of a PLD that enhances the disablement of one or more power supplies during a normal mode of operation.

Removal of power supply $V_{CCAUX}$ during the awake mode is also facilitated through enhancement of the suspend circuit as exemplified in FIG. 6. In particular, upon deactivation of power supply $V_{CCAUX}$ during the awake mode, signal SENSE exhibits an undefined logic state, since transistors 628 and 630 are non-conductive. As such, the time required to activate transistor 610 in order to provide operational power to node 620 via power supply $V_{CCINT}$ is unknown. Thus, transistors 632-634 are employed to improve $V_{CCAUX}$ deactivation capability during the awake mode.

In particular, once power supply $V_{CCAUX}$ is removed during the awake mode, the voltage magnitude at node 620 is temporarily maintained by the capacitive loading imposed by PLD circuits 612. As such, transistor 618 is rendered conductive, which then causes the voltage magnitude at node 620 to be substantially applied to the source terminal of transistor 634, which renders transistor 634 conductive. The voltage magnitude at the control terminal of n-type MOS (NMOS) transistor 632 is then sufficient to render transistor 632 conductive as well, which deasserts signal SENSE to a logic low level, e.g., ground potential. Transistor 610 is then rendered conductive, which allows PLD circuits 612 to receive operational power from $V_{CCINT}$ via node 620. Transistor 618 operates substantially as described above in relation to transistor 518 of FIG. 5, whereby transistor 618 senses the deactivation of $V_{CCAUX}$ and in response becomes conductive to remove the current path between $V_{CCINT}$ and $V_{CCAUX}$ when $V_{CCAUX}$ is deactivated during the awake mode.

In addition, well bias circuit 608 asserts signal $VB_1$ and $VB_2$ to a voltage magnitude that is substantially equal to $V_{CCINT}$, thus prohibiting the forward bias of the body diode of transistor 606. As such, the impedance magnitude of the path from $V_{CCINT}$ through transistor 610, node 620, transistor 606, and $V_{CCAUX}$ is adequate to prevent current flow during the awake mode while $V_{CCAUX}$ is deactivated.

Figure 7:
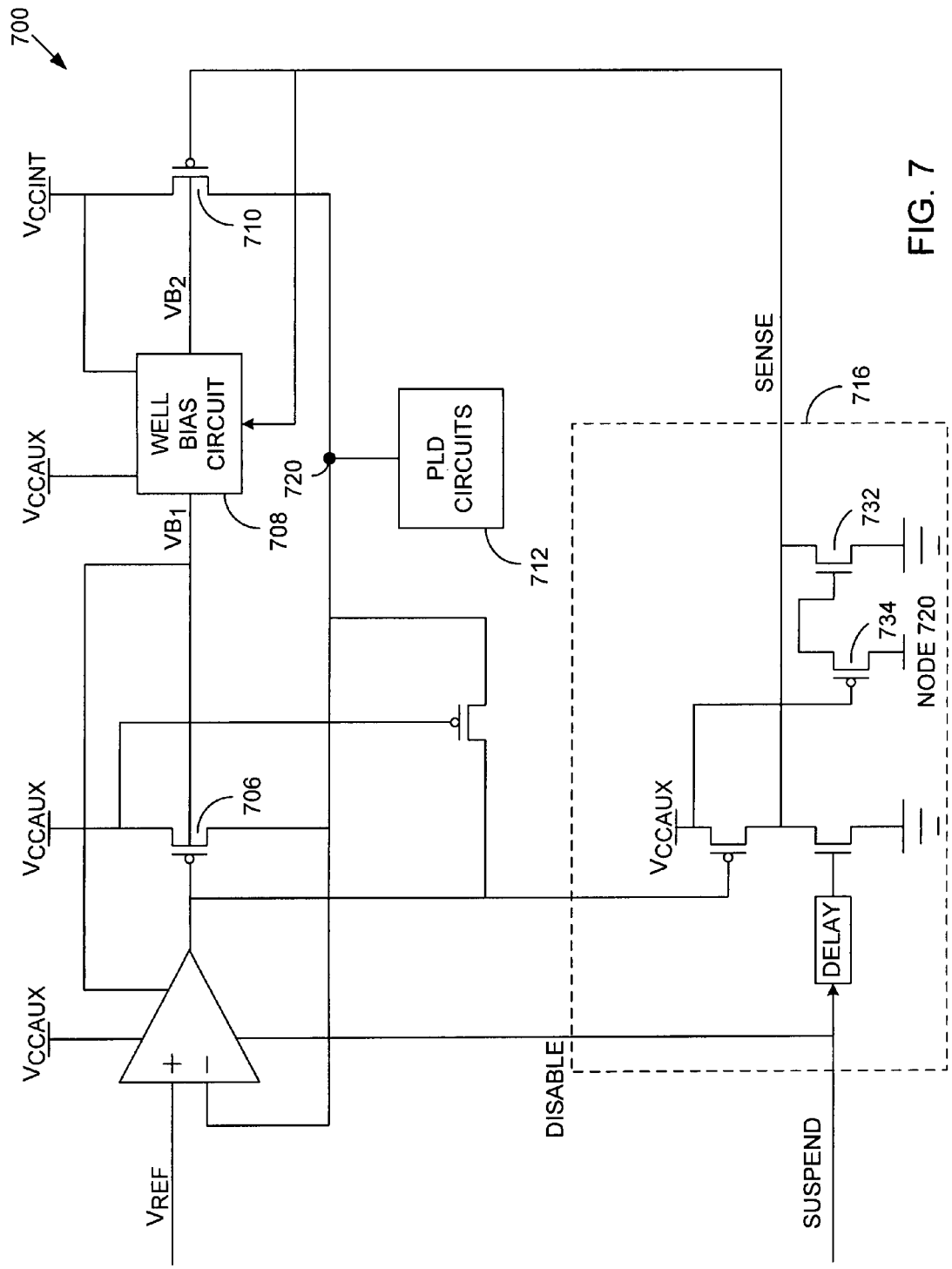
FIG. 7 illustrates an exemplary schematic diagram of an alternate embodiment of a PLD that enhances the disablement of one or more power supplies during a normal mode of operation.

In an alternate embodiment, suspend circuit 716 of FIG. 7 may also be utilized to enhance deactivation of power supply $V_{CCAUX}$ during the awake mode. In particular, the source terminal of transistor 734 is coupled to node 720 as illustrated. Upon removal of power supply $V_{CCAUX}$, transistor 734 is rendered conductive because the voltage magnitude at node 720 is temporarily maintained by the capacitive loading imposed by PLD circuits 712. Thus, transistor 732 is also rendered conductive, which deasserts signal SENSE to a logic low level, e.g., ground potential. Transistor 710 is then rendered conductive, which allows PLD circuits 712 to receive operational power from $V_{CCINT}$ via node 720.

Figure 8:
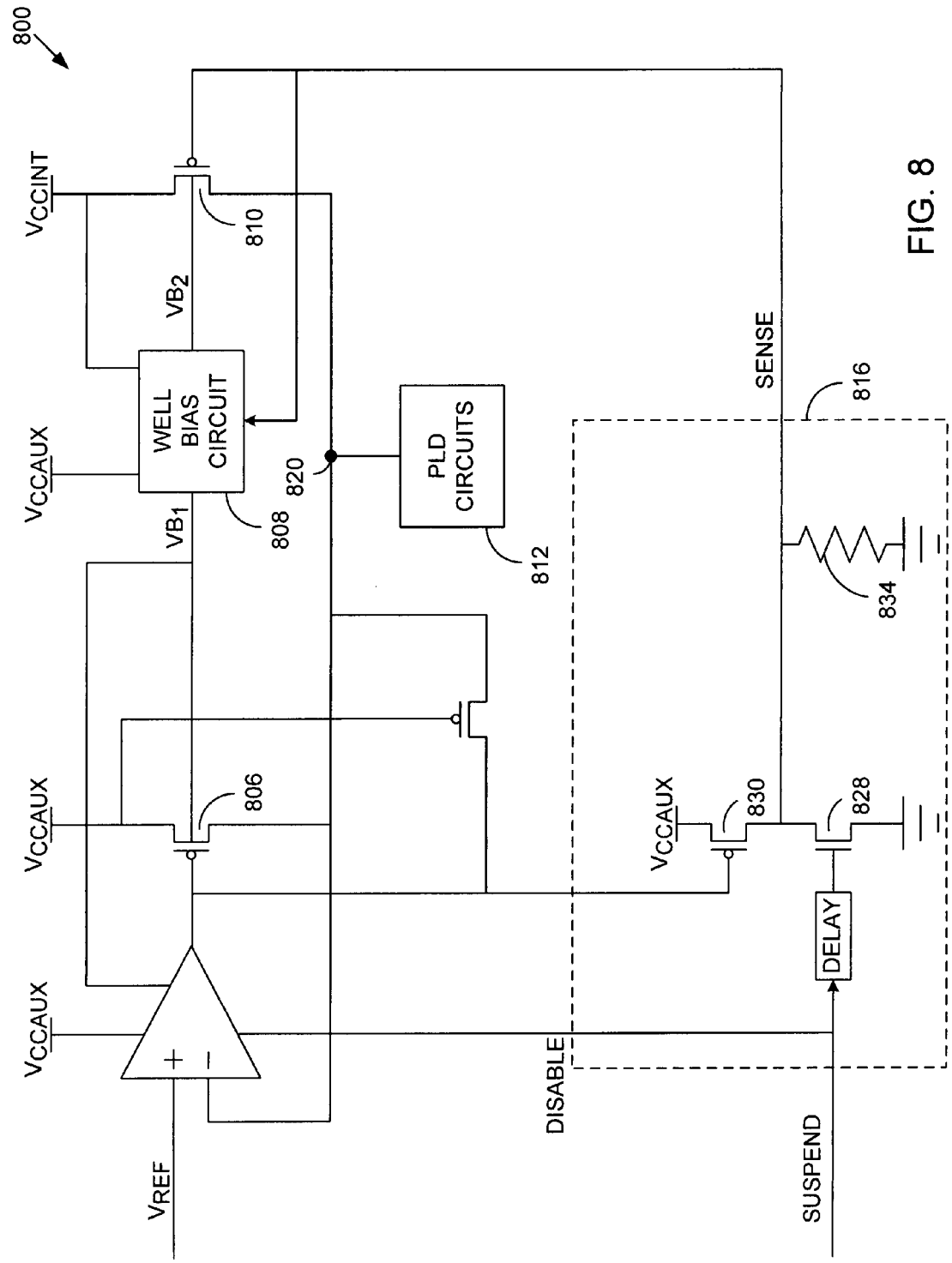
FIG. 8 illustrates an exemplary schematic diagram of an alternate embodiment of a PLD that enhances the disablement of one or more power supplies during a normal mode of operation.

In an alternate embodiment, suspend circuit 816 of FIG. 8 may also be utilized to enhance deactivation of power supply $V_{CCAUX}$ during the awake mode. In particular, should signal SENSE exhibit an undefined logic state due to the non-conductive states of transistors 628 and 630 caused by the deactivation of power supply $V_{CCAUX}$ during the awake mode, pull-down resistor 834 is employed to ensure that signal SENSE is deasserted to a logic low value. Transistor 810 is then rendered conductive, which allows PLD circuits 812 to receive operational power from $V_{CCINT}$ via node 820.

Figure 9:
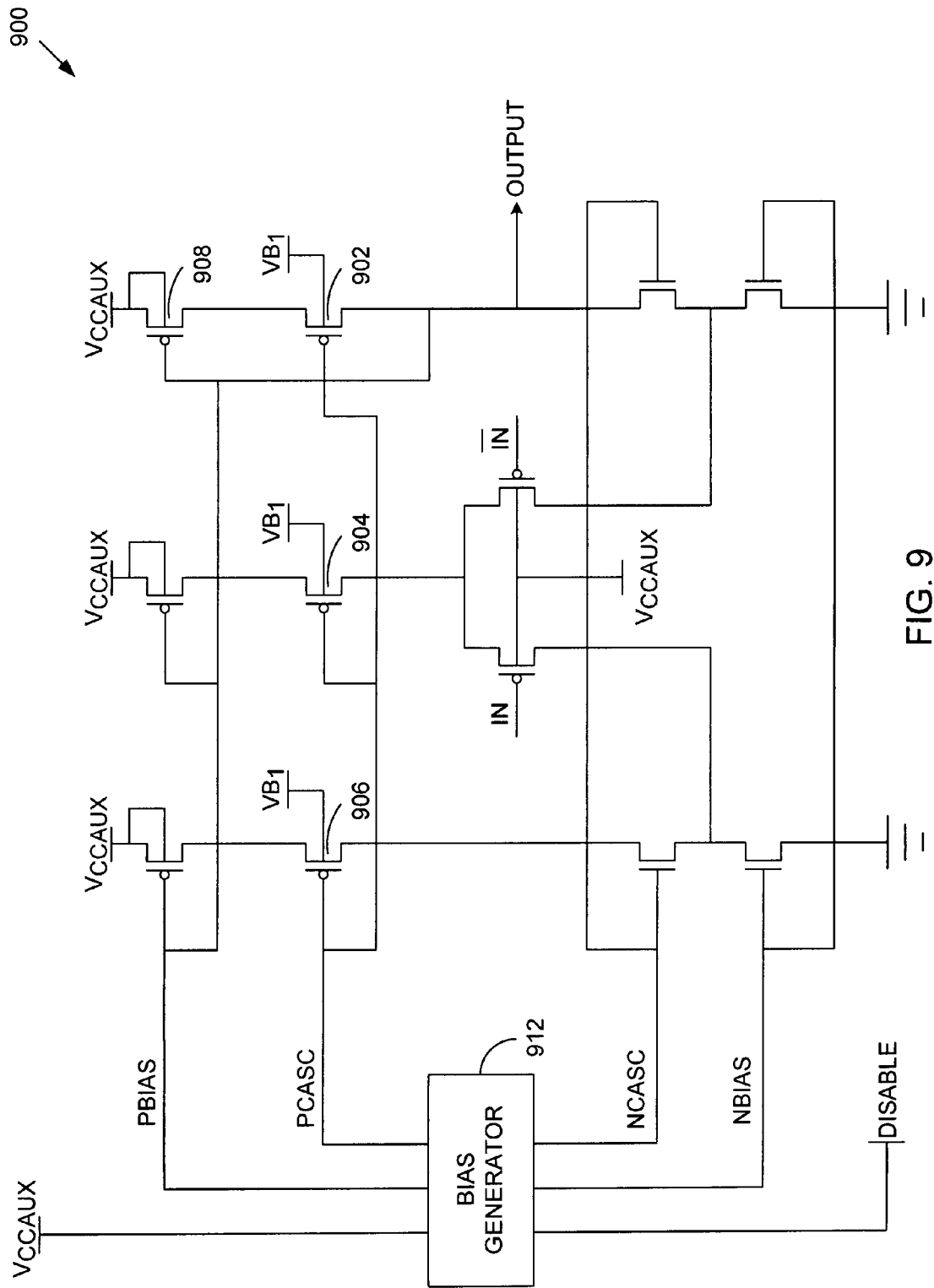
FIG. 9 illustrates an exemplary schematic diagram of a transconductance operational amplifier that may be used in the PLDs of FIGS. 5-8.

Turning to FIG. 9, an exemplary schematic diagram of operational transconductance amplifier 900 is illustrated, which may be used to implement the operational amplifier as illustrated in FIGS. 5-8. It is understood, however, that circuit topologies other than the configuration of FIG. 9 may be used to implement the operational amplifier, while the substrate biasing techniques as exemplified in FIGS. 9 and 10 may continue to be utilized.

Bias generator 912 generates bias signals PBIAS, PCASC, NBIAS and NCASC as illustrated. In normal mode, bias generator 912 receives the deasserted DISABLE signal and generates the PBIAS and PCASC bias signals, whose voltage magnitudes are several hundred milli-volts lower than the voltage magnitude of $V_{CCAUX}$. Bias generator 912 also generates bias signals NBIAS and NCASC, whose voltage magnitudes are several hundred milli-volts higher than ground potential.

In suspend mode, signal DISABLE is asserted, which causes bias generator 912 to increase the voltage magnitude of bias signals PBIAS and PCASC to be substantially equal to $V_{CCAUX}$. Bias generator 912 also decreases the voltage magnitude of bias signals NBIAS and NCASC to be substantially equal to ground potential. Should $V_{CCAUX}$ be disabled, the voltage magnitude of bias signals PBIAS and PCASC becomes substantially equal to ground potential.

Signal OUTPUT of operational transconductance amplifier 900 is coupled to the gate terminal of, e.g., transistor 806, which assumes a voltage magnitude that is substantially equal to $V_{CCINT}$ in response to the deactivation of power supply $V_{CCAUX}$ as discussed above. In order to prevent the forward bias of the body diodes of transistors 902-906, the substrate connections of transistors 902-906 are coupled to signal $VB_1$ as provided by, e.g., well bias circuit 808, whose magnitude is substantially equal to the voltage magnitude of $V_{CCINT}$. In addition, transistor 908 is rendered non-conductive because the voltage magnitude at the control and source terminals of transistor 908 are also substantially equal to ground potential. In response, the low-impedance current path between power supplies $V_{CCINT}$ and $V_{CCAUX}$ is removed within operational transconductance amplifier 900 during the deactivation of power supply $V_{CCAUX}$.

Figure 10:
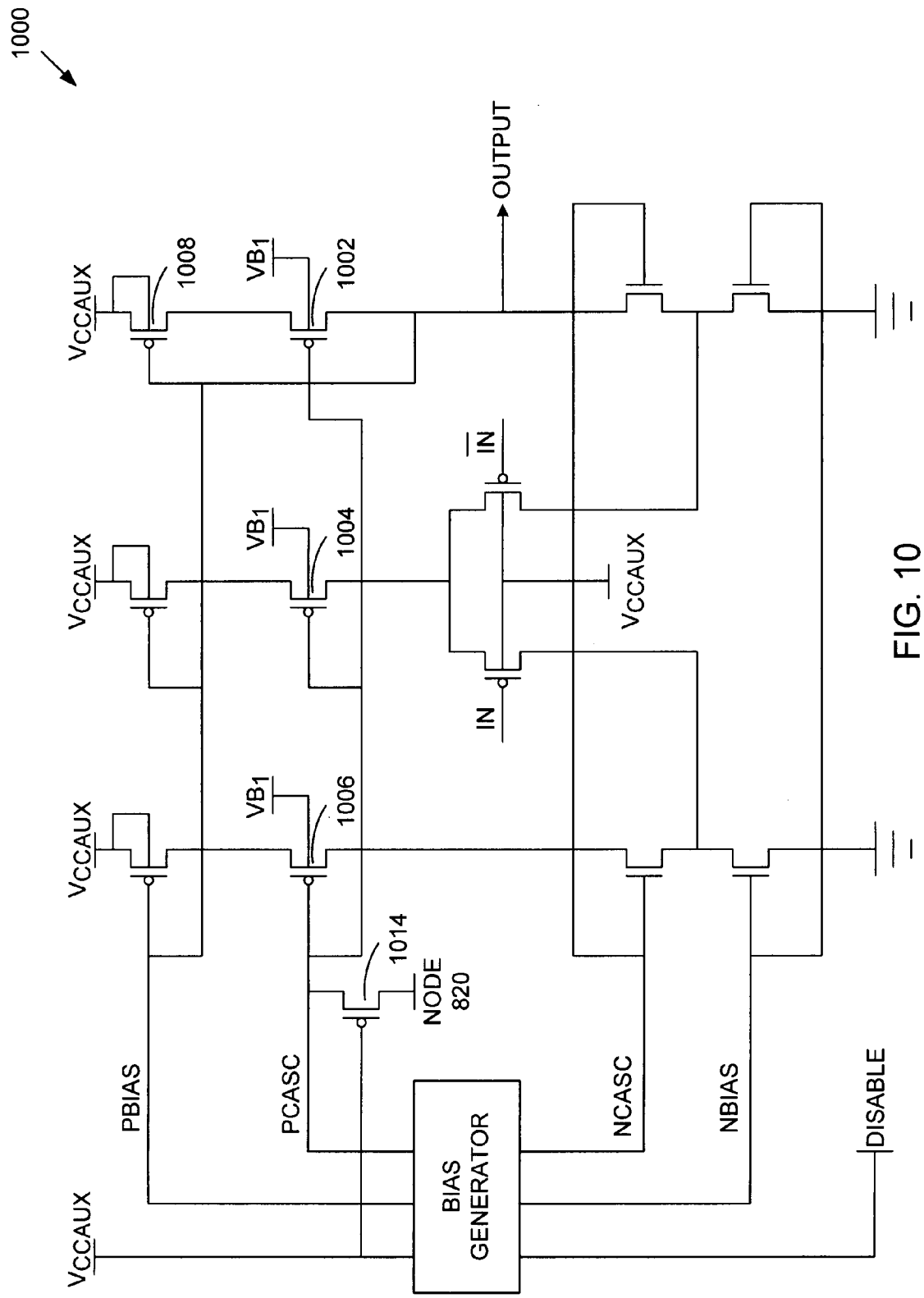
FIG. 10 illustrates an exemplary schematic diagram of an alternate embodiment of a transconductance operational amplifier that may be used in the PLDs of FIGS. 5-8.

Turning to FIG. 10, an alternate embodiment of operational transconductance amplifier 1000 is illustrated in which additional protection against low-impedance current paths between power supplies $V_{CCINT}$ and $V_{CCAUX}$ is implemented. In particular, bias signal terminal PCASC is coupled to the drain terminal of transistor 1014, such that when $V_{CCAUX}$ is deactivated, thus rendering the voltage magnitude of bias signal PCASC to be substantially equal to ground potential, transistor 1014 is rendered conductive to couple node 820 of FIG. 8 to the control terminals of transistors 1002-1006, which renders transistors 1002-1006 non-conductive. In such an instance, both transistors 1002 and 1008 prevent the existence of a low-impedance current path between power supplies $V_{CCINT}$ and $V_{CCAUX}$ when power supply $V_{CCAUX}$ is deactivated.

Turning to FIG. 11A, an alternate embodiment of PLD 1100 is exemplified, in which operational amplifier 1114 of PLD portion 1102 is physically separated from transistor 1110 of PLD portion 1104, which as discussed above, applies a voltage magnitude that is substantially equal to $V_{CCINT}$ to node 1108 during suspend mode, or when $V_{CCAUX}$ is deactivated during the awake mode. It is noted that the voltage magnitude at node 1108 may be considered a global signal that is to be routed throughout PLD 1100 and thus may not be co-located with the voltage regulator of PLD portion 1102.

The operation of PLD portion 1104 is identical to the discussion above relating to FIGS. 5-8. PLD portion 1102, however, contains NWELL bias 1106 that supplies signal $VB_3$ to operational amplifier 1114. Signal $VB_3$ is the substrate bias potential that is to be coupled to the substrate bias terminals of transistors, e.g., transistors 902-906 of operational amplifier 900 as discussed above in relation to FIG. 9, instead of bias signal $VB_1$ that is supplied by NWELL bias 1116.

Turning to FIG. 11B, an exemplary schematic diagram of NWELL bias 1106 is illustrated. In operation, NWELL bias 1106 provides signal $VB_3$ that assumes a voltage magnitude that is substantially equal to either $V_{CCAUX}$ or $V_{CCINT}$ depending upon which power supply is deactivated. If $V_{CCAUX}$ is deactivated, for example, then the input to inverter 1152 is substantially at a logic low level, which causes a logic high level to exist at the output of inverter 1152. Since inverter 1152 derives operational power from node 1108, then the voltage magnitude at the output of inverter 1152 is substantially equal to $V_{CCINT}$, thus transistor 1154 is rendered non-conductive. Since the control terminal of transistor 1156 is at a logic low level and the voltage magnitude at the source terminal of transistor 1156 is substantially equal to $V_{CCINT}$, then transistor 1156 is rendered conductive and applies the voltage at node 1108, i.e., a voltage magnitude that is substantially equal to $V_{CCINT}$, as signal $VB_3$. Thus, the substrate potential of select transistors within operational amplifier 1114 is substantially equal to $V_{CCINT}$, which is the correct result when $V_{CCAUX}$ is deactivated as discussed above.

If $V_{CCINT}$ is deactivated, on the other hand, then the input to inverter 1152 is substantially at a logic high level, but since inverter 1152 derives operational power from node 1108, then the voltage magnitude at the output of inverter 1152 is substantially equal to ground potential, which renders transistor 1154 conductive. Since the control terminal of transistor 1156 is at a logic high level and the voltage magnitude at the source terminal of transistor 1156 is substantially equal to ground potential, then transistor 1156 is rendered non-conductive. As such, transistor 1154 applies a voltage magnitude that is substantially equal to $V_{CCAUX}$ as signal $VB_3$, which is the correct result when $V_{CCINT}$ is deactivated as discussed above.

Turning to FIG. 11C, an alternate embodiment of NWELL bias 1106 is exemplified. If $V_{CCAUX}$ is deactivated, for example, then the control terminal of transistor 1162 is substantially at a logic low level, which renders transistor 1162 conductive. Since the control terminal of transistor 1160 is at a logic high level and the voltage magnitude at the source terminal of transistor 1160 is substantially equal to ground potential, then transistor 1160 is rendered non-conductive. As such, transistor 1162 applies the voltage at node 1108, i.e., a voltage magnitude that is substantially equal to $V_{CCINT}$, as signal $VB_3$. Thus, the substrate potential of select transistors within operational amplifier 1114 is substantially equal to $V_{CCINT}$, which is the correct result when $V_{CCAUX}$ is deactivated as discussed above.

If $V_{CCINT}$ is deactivated, on the other hand, then the control terminal of transistor 1160 is substantially at a logic low level, which renders transistor 1160 conductive. Since the control terminal of transistor 1162 is at a logic high level and the voltage magnitude at the source terminal of transistor 1162 is substantially equal to ground potential, then transistor 1162 is rendered non-conductive. As such, transistor 1160 applies a voltage magnitude that is substantially equal to $V_{CCAUX}$ as signal $VB_3$. Thus, the substrate potential of select transistors within operational amplifier 1114 is substantially equal to $V_{CCAUX}$, which is the correct result when $V_{CCINT}$ is deactivated as discussed above.

Figure 12:
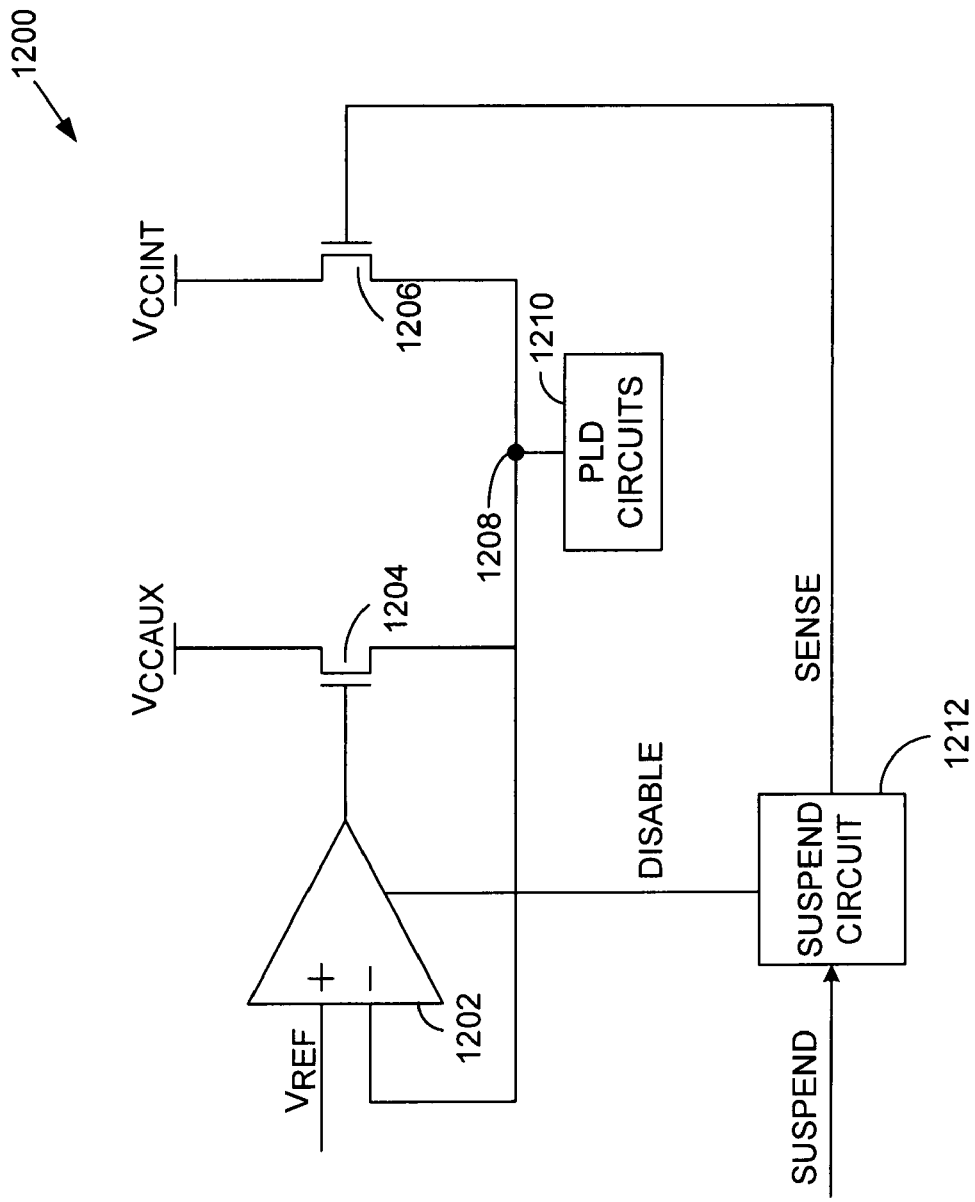
FIG. 12 illustrates an exemplary schematic diagram of an alternate embodiment of a PLD that facilitates the disablement of one or more power supplies during either of a normal, or low-power, mode of operation.

Turning to FIG. 12, an alternate embodiment of PLD 1200 is illustrated, whereby NMOS control circuitry is instead used to alternate between enabled and disabled power supplies without creating low-impedance current paths. During normal mode, operational amplifier 1202 is active to control the conductivity state of NMOS transistor 1204 such that the voltage magnitude present at node 1208 is regulated to be substantially equal to $V_{REF}$. In addition, signals SUSPEND, DISABLE, and SENSE are deasserted to a logic low level such that transistor 1206 isolates $V_{CCINT}$ from node 1208. Deactivation of $V_{CCINT}$ during the normal mode is acceptable, since $V_{CCINT}$ is already isolated from node 1208, thereby removing any low-impedance current paths that may exist between $V_{CCAUX}$ and $V_{CCINT}$. Deactivation of $V_{CCAUX}$ during the normal mode is also acceptable, since the output of operational amplifier 1202 is deasserted to a logic low potential, which renders transistor 1204 non-conductive. As such, any low-impedance current paths that may exist between $V_{CCAUX}$ and $V_{CCINT}$ are removed.

During the suspend mode, signals SUSPEND, DISABLE, and SENSE are asserted to a logic high level such that transistor 1206 provides operational power to PLD circuits 1210 from $V_{CCINT}$ via node 1208. In addition, the output of operational amplifier 1202 is deasserted to a logic low potential to render transistor 1204 non-conductive. Deactivation of $V_{CCAUX}$ during suspend mode is acceptable, since transistor 1204 is non-conductive, thereby removing any low-impedance current paths that may exist between $V_{CCAUX}$ and $V_{CCINT}$. Deactivation of $V_{CCINT}$ during suspend mode is also acceptable because transistor 1204 is rendered non-conductive, thereby removing any low-impedance current paths that may exist between $V_{CCAUX}$ and $V_{CCINT}$.

Figure 13:
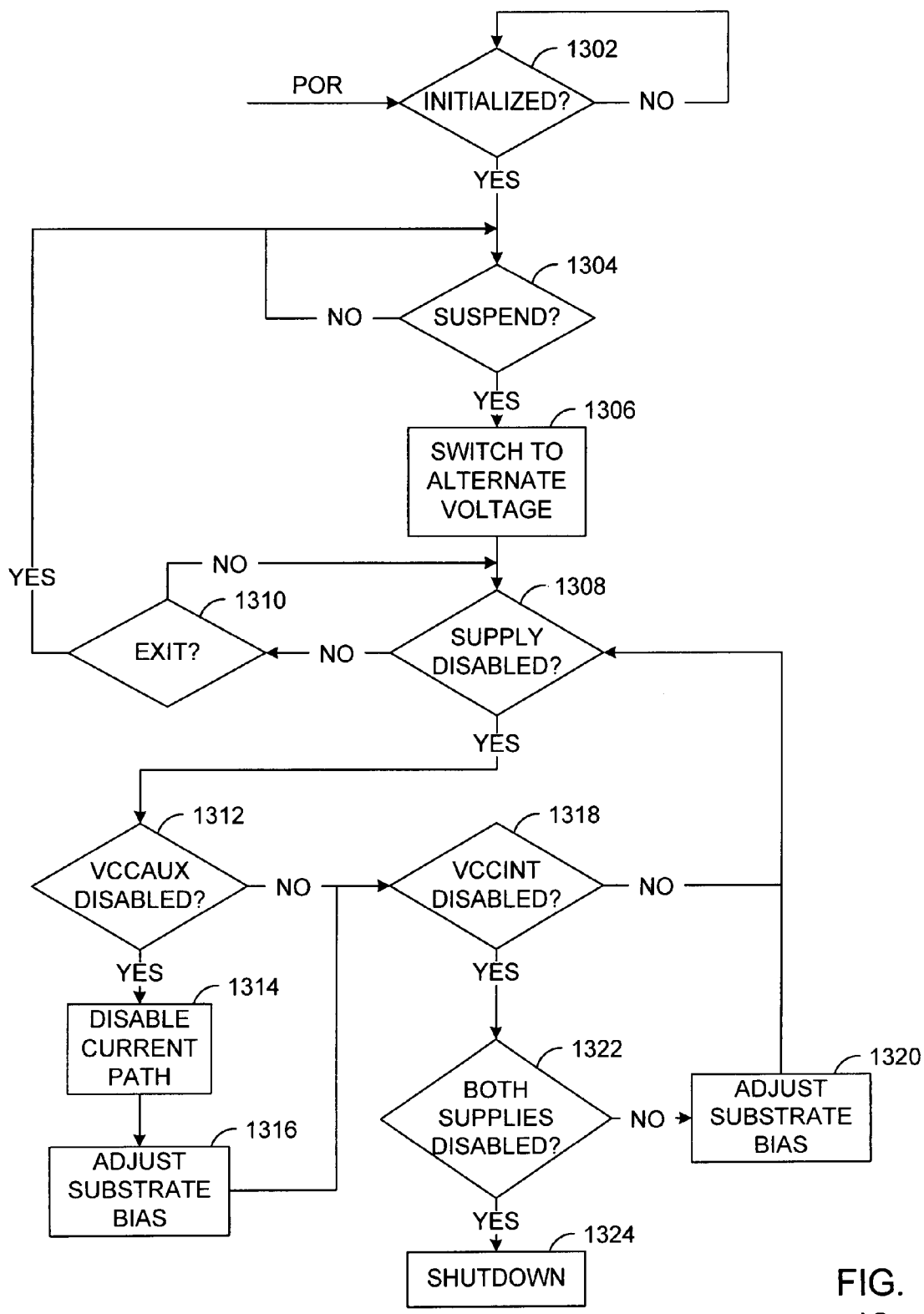
FIG. 13 illustrates an exemplary flow diagram of the operation of a PLD in response to the deactivation of one or more power supplies during a suspend mode of operation.

Turning to FIG. 13, a flow diagram of the operation of suspend mode is exemplified whereby deactivation of one or more power supplies is facilitated. Step 1302 is entered during power on reset (POR), whereby the PLD undergoes an initialization sequence, which when completed, starts the monitoring for suspend mode as in step 1304. In other words, the PLD continuously monitors the logic state of signal SUSPEND to determine if the suspend mode is activated.

Once suspend mode is activated, all non-essential PLD functions are shut down to minimize power dissipation. All writable clocked elements are write protected against spurious write operations and all PLD inputs and outputs are shut down, which allows the application state of the PLD to be held static during suspend mode. Operational power is, however, maintained to PLD circuits, e.g., 512. In addition, step 1306 requires that operational power to PLD circuits 512 be derived from $V_{CCINT}$, instead of $V_{CCAUX}$, via activation of transistor, e.g., 510, via signal SENSE. Since $V_{CCINT}$ is typically at a lower voltage magnitude than $V_{CCAUX}$, additional power savings is realized due to the associated decrease in leakage current within PLD circuits 510.

While in suspend mode, step 1308 constantly monitors each power supply to determine if one or more power supplies have been deactivated. If no power supplies are deactivated, then step 1310 determines if the suspend mode is still active. If so, then power supply monitoring continues as in step 1308. If, however, signal SUSPEND is deasserted, then the suspend mode is terminated and processing returns to step 1304 to continue monitoring for the next suspend mode sequence.

The power supply monitoring of step 1308 is performed by, e.g., well bias circuit 508 and transistor 518. If $V_{CCAUX}$ is deactivated, for example, then transistor 518 becomes conductive as in step 1312 to detect the deactivation of $V_{CCAUX}$. In response, the voltage magnitude at the control terminal of transistor 506 is made to be substantially equal to $V_{CCINT}$, which renders 506 non-conductive. As such, the current path between $V_{CCINT}$ and $V_{CCAUX}$ is disabled as in step 1314. In addition, well bias circuit 508 asserts signal $VB_1$ to the voltage magnitude of $V_{CCINT}$ in step 1316, so as to prevent forward bias of the body diode of transistor 506 and transistors internal to operational amplifier, e.g., 502, as discussed above in relation to FIGS. 9 and 10.

Well bias circuit 508 also monitors whether $V_{CCINT}$ is deactivated as in step 1318. If so, then step 1322 determines if both $V_{CCINT}$ and $V_{CCAUX}$ are deactivated, whereby the PLD transitions to shutdown mode as in step 1324 if both $V_{CCINT}$ and $V_{CCAUX}$ are deactivated. If, on the other hand, $V_{CCAUX}$ remains active, then well bias circuit 508 deasserts signal $VB_2$ to ground potential as in step 1320 and processing returns to step 1308 to determine any other power supplies that may be activated or deactivated. If not, then the suspend mode continues to be monitored as in step 1310.

Figure 14:
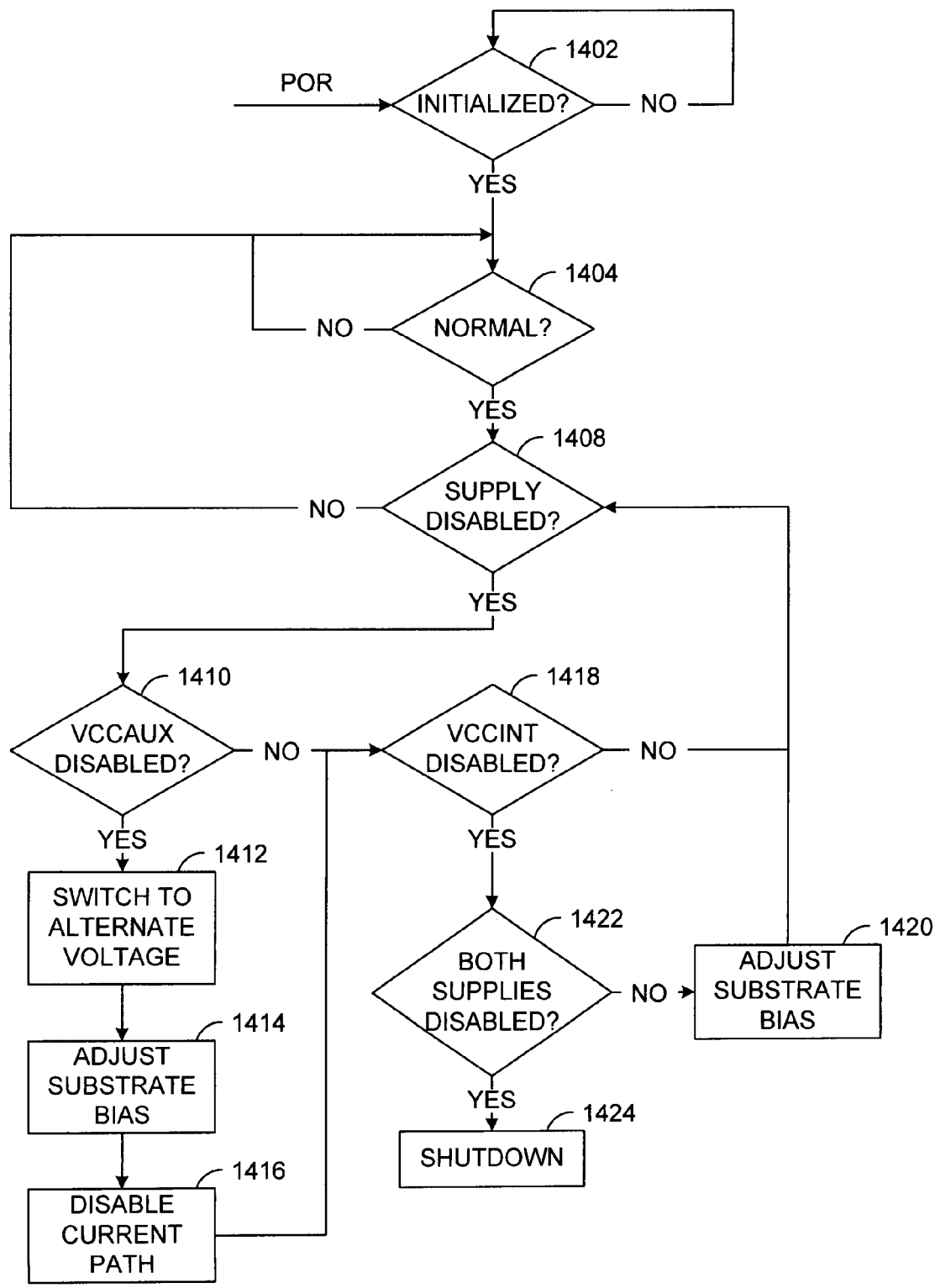
FIG. 14 illustrates an exemplary flow diagram of the operation of a PLD in response to the deactivation of one or more power supplies during a normal mode of operation.

Turning to FIG. 14, a flow diagram of the operation of awake mode is exemplified whereby deactivation of one or more power supplies is facilitated. Step 1402 is entered during POR, whereby the PLD undergoes an initialization sequence, which when completed, starts the monitoring of the awake mode as in step 1404. In other words, the PLD continuously monitors the logic state of signal SUSPEND to determine if the awake mode is activated. If signal SUSPEND indicates that the suspend mode is active, then the operation as exemplified in FIG. 13 is executed. Otherwise, the normal mode is active and processing continues to step 1408, which determines if any power supplies are deactivated during the awake mode.

While in awake mode, steps 1404 and 1408 constantly monitor each power supply to determine if one or more power supplies have been deactivated during the awake mode. If no power supplies are deactivated, then monitoring continues. The power supply monitoring of step 1408 is performed by, e.g., well bias circuit 508 and suspend circuits 616, 716, and 816 as discussed above in relation to FIGS. 6-8. If $V_{CCAUX}$ is deactivated, as detected in step 1410, then operational power to PLD circuits 512 is derived from $V_{CCINT}$ in step 1412, instead of $V_{CCAUX}$, via activation of transistor, e.g., 510, via signal SENSE as enhanced by suspend circuits 616, 716, and 816. In addition, well bias circuit 508 asserts signal $VB_1$ to the voltage magnitude of $V_{CCINT}$ in step 1414, so as to prevent forward bias of the body diode of transistor 506 and transistors internal to operational amplifier, e.g., 502, as discussed above in relation to FIGS. 9 and 10. Further, transistor, e.g., 518, becomes conductive in step 1416 to remove the current path between $V_{CCINT}$ and $V_{CCAUX}$ when $V_{CCAUX}$ is deactivated.

Well bias circuit 508 also monitors whether $V_{CCINT}$ is deactivated as in step 1418. If so, then step 1422 determines if both $V_{CCINT}$ and $V_{CCAUX}$ are deactivated, whereby the PLD transitions to shutdown mode as in step 1424 if both $V_{CCINT}$ and $V_{CCAUX}$ are deactivated. If, on the other hand, $V_{CCAUX}$ remains active, then well bias circuit 508 deasserts signal $VB_2$ to ground potential as in step 1420 and processing returns to step 1408 to determine whether other power supplies are activated or deactivated. If not, then the awake mode continues to be monitored as in steps 1404 and 1408.

Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. An integrated circuit, comprising:
a voltage regulator coupled to receive a first power supply signal at a first node and adapted to provide a regulated voltage to a second node in response to a normal mode of operation of the integrated circuit;
a first transistor having a first conductor coupled to receive a second power supply signal at a third node and a second conductor coupled to the second node, the first transistor being adapted to provide the second power supply signal to the second node in response to deactivation of the first power supply signal;
a second transistor having a first conductor coupled to the second node, a control terminal coupled to the first node, and a second conductor coupled to the voltage regulator; and
wherein the second transistor senses deactivation of the first power supply signal and in response is adapted to prevent current flow between the first and third nodes.

2. The integrated circuit of claim 1, wherein the voltage regulator comprises:
an operational amplifier having a first input terminal coupled to receive a reference signal, a second input terminal coupled to receive a feedback signal from the second node, and an output terminal coupled to the second conductor of the second transistor; and
a third transistor having a first conductor coupled to the first node, a second conductor coupled to the second node, and a control terminal coupled to the output terminal of the operational amplifier.

3. The integrated circuit of claim 2, further comprising a well bias circuit coupled to a substrate terminal of the first transistor and a substrate terminal of the third transistor at a fourth node, the well bias circuit being adapted to apply variable voltage magnitudes to the substrate terminals of the first and third transistors in response to an activation state of the first power supply signal.

4. The integrated circuit of claim 3, wherein the operational amplifier comprises:
a fourth transistor having a first conductor coupled to the output terminal of the operational amplifier and a substrate terminal coupled to the fourth node;
a fifth transistor having a first conductor coupled to a second conductor of the fourth transistor and a control terminal coupled to the output terminal of the operational amplifier, the well bias circuit being further adapted to apply a variable voltage magnitude to the substrate terminal of the fourth transistor in response to the activation state of the first power supply signal.

5. The integrated circuit of claim 3, wherein the operational amplifier comprises:
a fourth transistor having a first conductor coupled to the output terminal of the operational amplifier;
a fifth transistor having a first conductor coupled to a second conductor of the fourth transistor and a control terminal coupled to the output terminal of the operational amplifier;
a sixth transistor having a first conductor coupled to a control terminal of the fourth transistor, a second conductor coupled to the second node, and a control terminal coupled to receive the first power supply signal at the first node; and
wherein the sixth transistor senses the deactivation of the first power supply signal and in response is adapted to render the fourth transistor non-conductive.

6. The integrated circuit of claim 3, further comprising a suspend circuit coupled to the output terminal of the operational amplifier and coupled to receive a suspend signal, the suspend circuit adapted to deactivate the operational amplifier in response to a first logic level of the suspend signal.

7. The integrated circuit of claim 6, wherein the suspend circuit comprises:
a fourth transistor having a first conductor coupled to receive the first power supply signal at the first node, a second conductor coupled to a control terminal of the first transistor, and a control terminal coupled to the output terminal of the operational amplifier;
a fifth transistor having a first conductor coupled to the second conductor of the fourth transistor and a control terminal coupled to receive the suspend signal; and
wherein the fourth transistor senses the deactivation of the operational amplifier and the fifth transistor is rendered conductive after a time delay in response to the first logic level of the suspend signal to render the first transistor conductive.

8. The integrated circuit of claim 7, wherein the suspend circuit further comprises:
a sixth transistor having a first conductor coupled to the output terminal of the operational amplifier and a control terminal coupled to receive the first power supply signal at the first node;

a seventh transistor having a first conductor coupled to the control terminal of the first transistor and a control terminal coupled to a second conductor of the sixth transistor; and wherein the sixth transistor senses deactivation of the first power supply signal and in response the seventh transistor renders the first transistor conductive to apply the second power supply signal to the second node.

9. The integrated circuit of claim 7, wherein the suspend circuit further comprises:

a sixth transistor having a control terminal coupled to receive the first power supply signal at the first node and a first conductor coupled to the second node;

a seventh transistor having a control terminal coupled to a second conductor of the sixth transistor and a first conductor coupled to the control terminal of the first transistor; and wherein the sixth transistor senses deactivation of the first power supply signal and in response the seventh transistor renders the first transistor conductive to apply the second power supply signal to the second node.

10. The integrated circuit of claim 7, wherein the suspend circuit further comprises a resistor having a first conductor coupled to the control terminal of the first transistor, the resistor being adapted to render the first transistor conductive to apply the second power supply signal to the second node in response to deactivation of the first power supply signal.

11. The integrated circuit of claim 2, further comprising a well bias circuit coupled to the second node and coupled to receive the first power supply signal at the first node, the well bias circuit adapted to provide a substrate bias signal to the operational amplifier in response to deactivation of the first power supply signal.

12. The integrated circuit of claim 11, wherein the well bias circuit comprises:

an inverter coupled to receive the first power supply signal at the first node and having a power supply input terminal coupled to the second node;

a third transistor having a first conductor coupled to receive the first power supply signal at the first node and a control terminal coupled to an output of the inverter;

a fourth transistor having a first conductor coupled to a second conductor of the third transistor, a control terminal coupled to receive the first power supply signal at the first node, and a second conductor coupled to the second node; and wherein the fourth transistor senses deactivation of the first power supply signal and in response applies the second power supply signal as the substrate bias signal.

13. The integrated circuit of claim 11, wherein the well bias circuit comprises:

a third transistor having a first conductor coupled to receive the first power supply signal at the first node and a control terminal coupled to receive the second power supply signal at the third node;

a fourth transistor having a first conductor coupled to a second conductor of the third transistor, a control terminal coupled to receive the first power supply signal at the first node, and a second conductor coupled to the second node; and wherein the fourth transistor senses deactivation of the first power supply signal and in response applies the second power supply signal as the substrate bias signal.

14. A method to facilitate deactivation of power supply signals received by an integrated circuit, the method comprising:

deriving operational power from a first power supply signal at a first node during a normal mode of operation;

sensing, by a transistor, deactivation of the first power supply signal;

deriving operational power from a second power supply signal at a second node in response to sensing the deactivation of the first power supply signal during a suspend mode of operation; and removing a current path between the first and second nodes by the integrated circuit in response to the deactivation of the first power supply signal in order to eliminate a low-impedance current oath between the first power supply signal and the second power supply signal during the suspend mode of operation.

15. A system, comprising:

a first power supply adapted to provide a first power supply signal to a first node;

a second power supply adapted to provide a second power supply signal to a second node; and an integrated circuit including, a first transistor having a first conductor coupled to receive the second power supply signal and a second conductor coupled to a third node, the first transistor being adapted to provide the second power supply signal to the third node in response to a deactivation of the first power supply;

a second transistor having a first conductor coupled to the third node and a control terminal coupled to the first node;

an operational amplifier having a first input terminal coupled to receive a reference signal and a second input terminal coupled to receive a feedback signal from the third node;

a third transistor having a first conductor coupled to the first node, a second conductor coupled to the third node, and a control terminal coupled to an output terminal of the operational amplifier; and wherein the second transistor senses deactivation of the first power supply signal and in response is adapted to render the third transistor non-conductive to prevent current flow between the first and second nodes.

16. The system of claim 15, wherein the integrated circuit further comprises a first well bias circuit coupled to a substrate terminal of the first transistor and a substrate terminal of the third transistor, the well bias circuit being adapted to apply the second power supply signal to the substrate terminal of the third transistor in response to the deactivation of the first power supply.

17. The system of claim 16, wherein the integrated circuit further comprises a second well bias circuit coupled to the operational amplifier, the second well bias circuit being adapted to apply the second power supply signal as a substrate bias signal to the operational amplifier in response to the deactivation of the first power supply.

18. The system of claim 17, wherein the second well bias circuit comprises:

an inverter coupled to receive the first power supply signal at the first node and having a power supply input terminal coupled to the third node;

a fourth transistor having a first conductor coupled to receive the first power supply signal at the first node and a control terminal coupled to an output of the inverter;

a fifth transistor having a first conductor coupled to a second conductor of the fourth transistor, a control terminal coupled to receive the first power supply signal at the first node, and a second conductor coupled to the third node; and wherein the fifth transistor senses deactivation of the first power supply and in response applies the second power supply signal as the substrate bias signal to the operational amplifier.

19. The system of claim 17, wherein the second well bias circuit comprises:

a fourth transistor having a first conductor coupled to receive the first power supply signal at the first node and a control terminal coupled to receive the second power supply signal at the second node;

a fifth transistor having a first conductor coupled to a second conductor of the fourth transistor, a control terminal coupled to receive the first power supply signal at the first node, and a second conductor coupled to the third node; and wherein the fifth transistor senses deactivation of the first power supply and in response applies the second power supply signal as the substrate bias signal to the operational amplifier.

* * * * *